US008987751B2

(12) United States Patent
Ihara

(10) Patent No.: US 8,987,751 B2
(45) Date of Patent: Mar. 24, 2015

(54) PHOTODIODE DEVICE BASED ON WIDE BANDGAP MATERIAL LAYER AND BACK-SIDE ILLUMINATION (BSI) CMOS IMAGE SENSOR AND SOLAR CELL INCLUDING THE PHOTODIODE DEVICE

(75) Inventor: Hisanori Ihara, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 425 days.

(21) Appl. No.: 13/301,270

(22) Filed: Nov. 21, 2011

(65) Prior Publication Data
US 2012/0175636 A1     Jul. 12, 2012

(30) Foreign Application Priority Data

Jan. 12, 2011    (KR) .................. 10-2011-0003156

(51) Int. Cl.
H01L 27/148    (2006.01)
H01L 31/103    (2006.01)
H01L 27/146    (2006.01)
H01L 31/0216   (2014.01)
H01L 31/0232   (2014.01)

(52) U.S. Cl.
CPC .......... H01L 31/103 (2013.01); H01L 27/1461 (2013.01); H01L 27/14632 (2013.01); H01L 27/1464 (2013.01); H01L 27/14687 (2013.01); H01L 31/02161 (2013.01); H01L 31/02162 (2013.01); H01L 31/02327 (2013.01); Y02E 10/52 (2013.01)
USPC .. 257/77; 257/432; 257/E27.13; 257/E31.127

(58) Field of Classification Search
CPC ............ H01L 27/1461; H01L 27/1462; H01L 27/1463; H01L 27/1464; H01L 27/14687
See application file for complete search history.

(56) References Cited

U.S. PATENT DOCUMENTS

| 8,053,856 | B1* | 11/2011 | Tu et al. ................. 257/432 |
| 8,420,438 | B2* | 4/2013 | Hynecek et al. ............ 438/98 |
| 8,629,486 | B2* | 1/2014 | Ahn et al. ................ 257/292 |
| 2009/0146148 | A1* | 6/2009 | Pyo ........................ 257/59 |
| 2010/0090303 | A1* | 4/2010 | Takizawa ................. 257/432 |
| 2010/0201834 | A1* | 8/2010 | Maruyama et al. ........ 348/222.1 |
| 2010/0291730 | A1* | 11/2010 | Uya et al. ................ 438/73 |
| 2011/0090383 | A1* | 4/2011 | Yamaguchi ............... 348/294 |
| 2011/0186951 | A1* | 8/2011 | Pyo ...................... 257/432 |
| 2011/0204467 | A1* | 8/2011 | Ohchi et al. ............. 257/443 |
| 2011/0227185 | A1* | 9/2011 | Yamaguchi ............... 257/443 |

(Continued)

FOREIGN PATENT DOCUMENTS

| JP | 2008-294479 A | 12/2008 |
| JP | 2009-016431 A | 1/2009 |
| JP | 2009-088030 A | 4/2009 |

*Primary Examiner* — Minh-Loan Tran
*Assistant Examiner* — Fazli Erdem
(74) *Attorney, Agent, or Firm* — Harness, Dickey & Pierce, P.L.C.

(57) ABSTRACT

According to example embodiments, a photodiode system may include a substrate, and at least one photodiode in the substrate, and a wideband gap material layer on a first surface of the substrate. The at least one photodiode may be between an insulating material in a horizontal plane. According to example embodiments, a back-side-illumination (BSI) CMOS image sensor and/or a solar cell may include a photodiode device. The photodiode device may include a substrate, at least one photodiode in the substrate, a wide bandgap material layer on a first surface of the substrate, and an anti-reflective layer (ARL) on the wide bandgap material layer.

10 Claims, 26 Drawing Sheets

(56) References Cited

U.S. PATENT DOCUMENTS

| | | | |
|---|---|---|---|
| 2011/0298072 A1* | 12/2011 | Chuang et al. | 257/432 |
| 2011/0316002 A1* | 12/2011 | Ahn et al. | 257/77 |
| 2012/0009720 A1* | 1/2012 | Shim et al. | 438/70 |
| 2012/0038015 A1* | 2/2012 | Huang et al. | 257/437 |
| 2012/0280348 A1* | 11/2012 | Chou et al. | 257/435 |
| 2013/0228886 A1* | 9/2013 | JangJian et al. | 257/432 |

* cited by examiner (a) RELATED ART (b)

(a) RELATED ART (b)

B IIP

PHOTODIODE DEVICE BASED ON WIDE BANDGAP MATERIAL LAYER AND BACK-SIDE ILLUMINATION (BSI) CMOS IMAGE SENSOR AND SOLAR CELL INCLUDING THE PHOTODIODE DEVICE

CROSS-REFERENCE TO RELATED APPLICATIONS

This application claims foreign priority under 35 U.S.C. §119 to the benefit of Korean Patent Application No. 10-2011-0003156, filed on Jan. 12, 2011, in the Korean Intellectual Property Office, the disclosure of which is incorporated herein in its entirety by reference.

BACKGROUND

1. Field

Example embodiments of the inventive concepts relate to a photodiode device and/or system, and more particularly, to a back-side-illumination (BSI) complementary-metal-oxide-semiconductor (CMOS) image sensor including a photodiode device and/or system based on a wide bandgap material layer, and/or a solar cell.

2. Related Art

A photodiode may be a photoelectric device configured to convert light into electric energy. Photodiodes may be used for a CMOS image sensor and/or solar cell. CMOS image sensors may be classified into front-side illumination (FSI) CMOS image sensors and back-side illumination (BSI) image sensors. In FSI CMOS image sensors, light may be incident to a front surface of a substrate on which an interconnection layer is disposed. In BSI CMOS image sensors, light may be incident to a rear surface disposed opposite the front surface of the substrate on which an interconnection layer is disposed.

Solar cells may be divided into two categories: inorganic solar cells and organic solar cells. Inorganic solar cells may be, for example, single-crystalline silicon solar cells or poly-silicon solar cells.

SUMMARY

Example embodiments of the inventive concepts relate to a photodiode device that may improve the efficiency of conversion of blue light into electricity.

Also, example embodiments of the inventive concepts relate to a back-side illumination (BSI) complementary metal-oxide-semiconductor (CMOS) sensor including a photodiode device, which may improve sensitivity to blue light and reduce and/or prevent crosstalk and a mixture of colors.

Furthermore, example embodiments of the inventive concepts relate to a solar cell including a photodiode device, which may improve the receiving efficiency of blue light to enhance electricity generation capability.

According to example embodiments of the inventive concepts, a photodiode device may include a substrate having a first surface and a second surface disposed opposite the first surface, at least photodiode in the semiconductor substrate and configured to convert incident light into electricity, and a wide bandgap material layer on the first surface of the substrate toward which the light is incident, the wide bandgap material layer having a wide energy bandgap.

According to example embodiments of the inventive concepts, a BSI CMOS image sensor may include the above-described photodiode device, and further include a metal interconnection layer on the second surface of the semiconductor substrate, an anti-reflective layer (ARL) on the wide bandgap material layer and configured to reduce and/or prevent reflection of the light; a color filter on the ARL, and a microlens disposed on the color filter.

The wide bandgap material layer may include a material having a low absorption coefficient with respect to blue light. For example, the wide bandgap material layer may include one of $p^+$-SiC, $p^+$-SiN, and $p^+$-SiCN. Also, the semiconductor substrate may be a $p^-$-type silicon substrate, and a $p^+$-silicon layer may be formed between the wide bandgap material layer and the semiconductor substrate.

The semiconductor substrate may be divided into a pixel array region and a peripheral circuit region, and the wide bandgap material layer may be formed on the entire pixel array region or only on a portion of the pixel array region corresponding to a blue pixel. Also, the wide bandgap material layer may be a laser annealed layer.

The ARL may include one of a first structure including a silicon nitride ($SiN_x$) layer; a second structure including a buffer layer and a hafnium oxide ($HfO_2$) layer; a third structure including a silicon oxide ($SiO_2$) layer and a silicon oxynitride (SiON) layer; a fourth structure including a buffer layer, a $SiN_x$ layer, and a titanium oxide ($TiO_2$) layer; a fifth structure including a buffer layer, a $HfO_2$ layer, and a $TiO_2$ layer; a sixth structure including a buffer layer, a slot plasma antenna (SPA) oxide layer, a $SiN_x$ layer, and a $TiO_2$ layer; a seventh structure including a buffer layer, an SPA oxide layer, a $SiN_x$ layer, and a $TiO_2$ layer; an eighth structure including a buffer layer, an SPA oxide layer, and a $SiN_x$ layer; a ninth structure including a buffer layer, an SPA oxide layer, a hafnium silicon oxide ($HfSiO_x$) layer, and a $TiO_2$ layer; and a tenth structure including a buffer layer, a $HfSiO_x$ layer, and a $TiO_2$ layer.

According to example embodiments of the inventive concepts, a solar cell may include the above-described photodiode device, and further include an ARL on the wide bandgap material layer and configured to prevent and/or reduce reflection of light; a first electrode in the ARL and electrically connected to the photodiode device; and a second electrode on the second surface of the semiconductor substrate and electrically connected to the photodiode device.

The photodiode device may have a PN junction diode structure through the entire thickness of the semiconductor substrate, and the wide bandgap material layer may be in contact with a front surface of an n-type semiconductor layer to which light is incident. Also, the solar cell may further include a microlens on the ARL.

According to example embodiments, a photodiode system may include a substrate, at least one photodiode in the substrate, and a wide bandgap material layer on a first surface of the substrate. The at least one photodiode in the substrate may be between an insulating material in a horizontal plane According to example embodiments a solar cell may include the photodiode system, and further include a first electrode electrically connected to the at least one photodiode, a second electrode electrically connected to the at least one photodiode. The wide bandgap material layer may include one of p+-SiC, p+-SiN, and p+-SiCN.

According to example embodiments, an image sensor may include the photodiode system, and further include a color filter, a microlens on the color filter, and a metal interconnection layer. The at least one photodiode may be on the metal interconnection layer and between the color filter and the metal interconnection layer.

According to example embodiments, a unit pixel may include the photodiode system, a transfer transistor operatively connected to the at least one photodiode of the photodiode system and configured to transfer charges generated by the at least one photodiode of the photodiode system to a floating diffusion region in the substrate for storage, a reset transistor operatively connected to the floating diffusion region, the reset transistor configured to reset charges stored in the floating diffusion region, a drive transistor configured to buffer signals corresponding to charges stored in the floating diffusion region, and a select transistor operatively connected to the drive transistor, the select transistor configured for selecting the unit pixel.

According to example embodiments, an imaging system may include a CMOS image sensor including the photodiode system, and a bus operatively connecting the CMOS image sensor to a processor. The processor may be configured to process an output of the CMOS image sensor.

BRIEF DESCRIPTION OF THE DRAWINGS

The foregoing and other features and advantages of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1A:
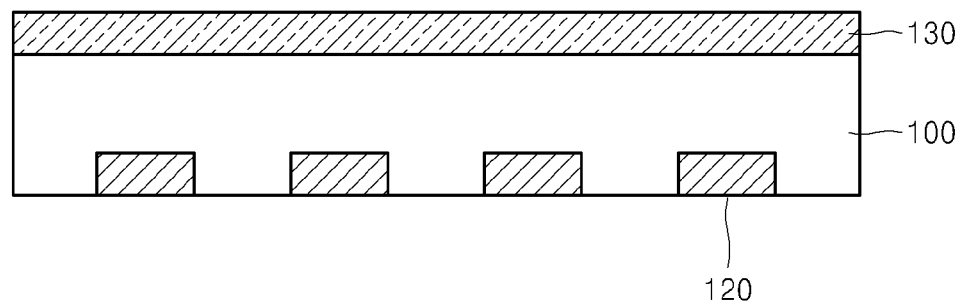
FIGS. 1A through 1C are cross-sectional views of a photodiode device including a wide bandgap material layer, according to example embodiments of the inventive concepts.

The inventive concepts will now be described more fully hereinafter with reference to the accompanying drawings, in which some example embodiments of the inventive concepts are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. It will be understood that when a layer is referred to as being "on" another layer or substrate, it can be directly on the other layer or substrate or intervening layers may also be present. In contrast, when an element is referred to as being "directly connected" or "directly coupled" or "directly on" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
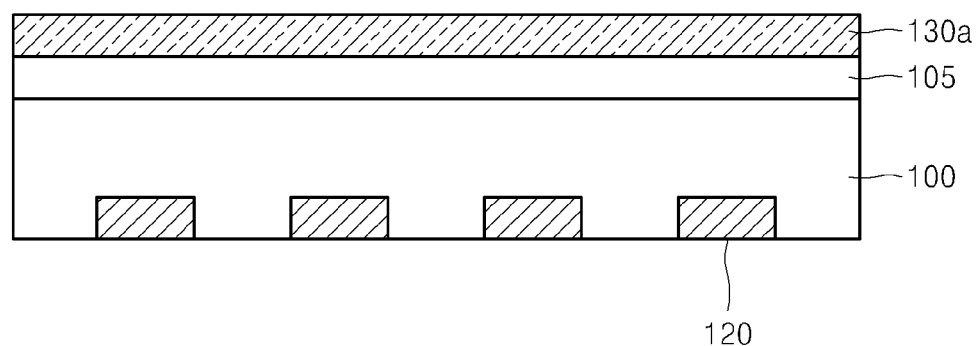
Figure 1C:
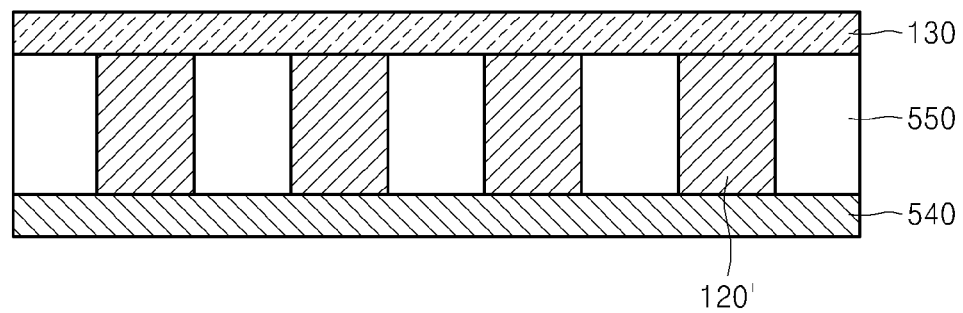

FIGS. 1A through 1C are cross-sectional views of a photodiode device including a wide bandgap material layer, according to example embodiments of the inventive concepts.

Referring to FIG. 1A, the photodiode device according to example embodiments may include a semiconductor substrate 100, a photodiode 120, and a wide bandgap material layer 130.

The semiconductor substrate 100 may include an epitaxial wafer, for example a wafer obtained by growing a crystalline material on a single crystalline silicon substrate. The epitaxial wafer may be used as the semiconductor substrate 100, but example embodiments of the inventive concepts are not limited thereto and one of various wafers, such as a polished wafer, an annealed wafer, or a silicon-on-insulator (SOI) wafer, may be used as the semiconductor substrate 100. For example, the semiconductor substrate 100 may be a $p^-$-type silicon substrate.

The photodiode 120 may be a PN junction diode, which may convert light energy into electric energy. That is, hole-electron pairs may be generated in a depletion region due to light incident to the photodiode 120, and generated holes and electrons may move to corresponding electrodes, thereby generating current. Accordingly, the photodiode 120 may be electrically connected to electrodes (not shown) from which the generated electrons and holes may be released. Also, an isolation layer (not shown) may be formed between the photodiodes 120 to isolate the photodiodes 120 from one another.

The photodiode 120 may be employed as a basic device for various photoelectric devices. For example, the photodiode 120 may be employed as a basic device configured to generate electricity in CMOS image sensors and solar cells. A CMOS image sensor using the photodiode device according to example embodiments will be described below in more detail with reference to FIGS. 4 through 15.

The wide bandgap material layer 130 may be a material layer having a wide energy bandgap, which may be formed of a material having a low absorption coefficient with respect to blue light. For example, the wide bandgap material layer may include a material having where the square root of the absorption coefficient For example, the wide bandgap material layer 130 may be formed of SiC, SiN, or SiCN. For example, the wide bandgap material layer 130 formed of SiC may have various crystalline structures and a wide energy bandgap of about 2 to 6 eV according to its crystalline structure. For example, the wide bandgap material layer 130 may include typical SiC structures, such as 3C-SiC, 6H-SiC, and 4H-SiC. Here, 3C-SiC may have an energy bandgap of about 2.23 eV, 6H-SiC may have an energy bandgap of about 2.86 eV, and 4H-SiC may have an energy bandgap of about 3.0 eV.

The wide bandgap material layer 130 may be formed of B-doped $p^+$-SiC, $p^+$-SiN, or $p^+$-SiCN, and $p^+$-SiC having an energy bandgap of about 1.3 to 1.5 eV for example.

The wide bandgap material layer 130 may have a low absorption coefficient with respect to incident light, particularly, blue light and improve the efficiency of conversion of blue light into electricity. Also, the wide bandgap material layer 130 may have a higher energy level than a substrate, particularly, a $p^-$-type silicon substrate and reduce and/or prevent leakage of generated electrons. By reducing the leakage of the electrons, crosstalk may be reduced, and a signal-to-noise ratio (SNR) may be improved, thereby enhancing the sensitivity of a CMOS image sensor to light, particularly, blue light.

Referring to FIG. 1B, a photodiode device according to example embodiments may be similar to the photodiode device of FIG. 1A, but a $p^+$-type silicon layer 105 may be further included between the semiconductor substrate 100 and a wide bandgap material layer 130a. The wide bandgap material layer 130a may include the same materials as the wide bandgap material layer 130 previously discussed. Since the semiconductor substrate 100 and the wide bandgap material layer 130 are described with reference to FIG. 1A, a description thereof will be omitted.

In a conventional BSI CMOS image sensor, the $p^+$-type silicon layer 105 may be formed on a surface of the semiconductor substrate 100 to reduce the resistance of the semiconductor substrate 100, but the $p^+$-type silicon layer 105 may weaken the sensitivity to blue light due to its absorptivity of blue light and cause the leakage of electrons through the $p^+$-type silicon layer 105. However, according to example embodiments, the wide bandgap material layer 130a may be formed in an upper region of the $p^+$-type silicon layer 105. The wide bandgap material layer 130a may lower the absorptivity of blue light to increase the efficiency of converting blue light into electricity. Also, the wide bandgap material layer 130a may reduce and/or prevent the leakage of electrons to reduce and/or prevent crosstalk.

Referring to FIG. 1C, a photodiode device according to example embodiments may include a lower support layer 540, a plurality of photodiodes 120', an insulating layer 550, and the wide bandgap material layer 130.

The lower support layer 540 may support the photodiode 120 and limit a bottom surface of the photodiode 120 from being exposed. When the photodiode device according to example embodiments is included in a solar cell, the lower support layer 540 may constitute a lower electrode (see FIG. 18, 19A, 19B) of the solar cell. The lower support layer 540 may include a transparent conductive oxide, such as ITO, Zinc Oxide, Indium Oxide, Indium Zinc Oxide (IZO), and the like, and/or a conductive polymer, for example a conductive polymer bonded with carbon nanotubes. The photodiode 120 may be formed through the entire substrate, unlike in FIG. 1A or 1B. Thus, a top surface of the photodiode 120 may be in contact with the wide bandgap material layer 130. The photodiode 120 of FIG. 1C may be a PN junction diode. The insulating layer 550 may function to isolate photodiodes 120 from one another.

The wide bandgap material layer 130 may be on the photodiode 120 and the insulating layer 550. As described above, the wide bandgap material layer 130 may be in contact with the top surface of the photodiode 120, that is, an N-type semiconductor layer. The function and material of the wide bandgap material layer 130 may be the same as described with reference to FIG. 1A. An electrode (not shown) may be formed through the wide bandgap material layer 130 to release electrons generated by the photodiode 120.

A solar cell using the photodiode device according to example embodiments will be described in more detail below with reference to FIGS. 19A through 19C.

Figure 2:
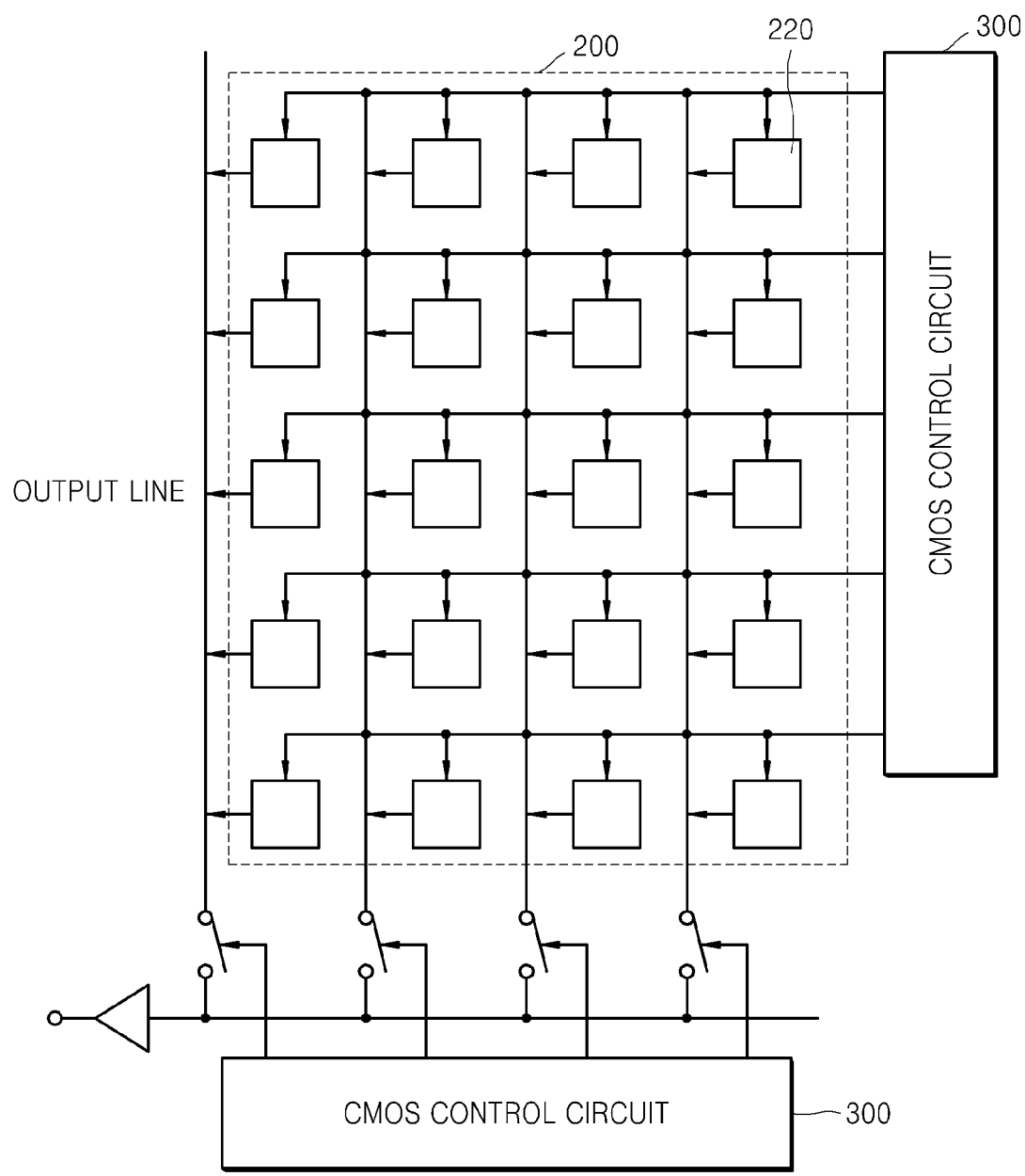
FIG. 2 is a layout diagram of a back-side illumination (BSI) complementary-metal-oxide-semiconductor (CMOS) image sensor including the photodiode device of FIG. 1A or 1B, according to example embodiments of the inventive concepts.

FIG. 2 is a layout of a BSI CMOS image sensor including the photodiode device of FIG. 1A or 1B, according to example embodiments of the inventive concepts.

Referring to FIG. 2, the BSI CMOS image sensor according to example embodiments may include a pixel array region 200 and at least one CMOS control circuit 300.

The pixel array region 200 may include a plurality of unit pixels 220 disposed in a matrix form. The CMOS control circuit 300 disposed around the pixel array region 200 may include a plurality of CMOS transistors and transmit desired (and/or alternatively predetermined) signals to each of the unit pixels 220 of the pixel array region 200 and control output signals.

Image sensors may be classified into active pixel sensors (APS) and passive pixel sensors (PPS) depending on the construction of an output unit configured to control the output of the pixel array region 200. An APS may include a plurality of transistors, such as a voltage transformer, a select transistor, and a source-follower, while an output unit of a PPS may include only a select switch. According to example embodiments, the BSI CMOS image sensor may be regarded as an APS, and thus, the pixel array region 200 may be referred to as an active pixel array region.

The BSI CMOS image sensor according to example embodiments may include the photodiode 120 of FIG. 1A or 1B. Thus, based on a wide bandgap material layer 130 or 130a formed in the pixel array region 200, the BSI CMOS image sensor may improve sensitivity to blue light and reduce crosstalk and increase a SNR to reduce and/or prevent a mixture of colors.

Figure 3:
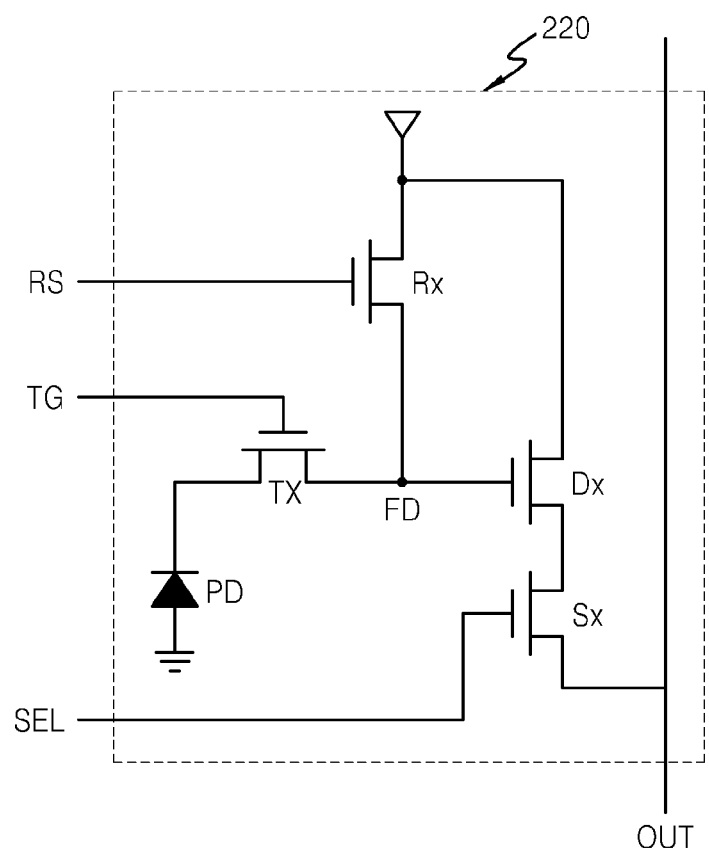
FIG. 3 is an equivalent circuit diagram of a unit pixel of the BSI CMOS image sensor of FIG. 2.

FIG. 3 is an equivalent circuit diagram of a unit pixel 220 of the BSI CMOS image sensor of FIG. 2.

Referring to FIG. 3, the unit pixel 220 of the BSI CMOS image sensor according to example embodiments may include a photodiode PD, a transfer transistor Tx, a reset transistor Rx, a drive transistor Dx, and a select transistor Sx. In FIG. 3, RS is a reset control signal, TG is a transfer control signal, SEL is a select control signal, and OUT is an output control signal.

The photodiode PD may be a PN junction diode described above with reference to FIG. 1A or 1B. The photodiode PD may receive light and generate charges, such as electrons or holes. The transfer transistor Tx may transfer charges generated by the photodiode PD to a floating diffusion (FD) region, and the reset transistor Rx may function to periodically reset charges stored in the FD region.

Furthermore, the drive transistor Dx may serve as a source-follower buffer amplifier and buffer signals corresponding to the charges charged in the FD region. The select transistor Sx may serve as a switch required for selecting the unit pixel 220.

Since a conventional CMOS image sensor receives selected light through a front surface thereof, a large amount of light may be absorbed or lost through a thick interlayer insulating layer to reduce a final amount of collected light. In particular, red light having a long wavelength may be consumed and greatly refracted through a thick interlayer insulating layer and an interconnection layer, thereby causing accumulation of crosstalk in adjacent pixels.

Figure 4:
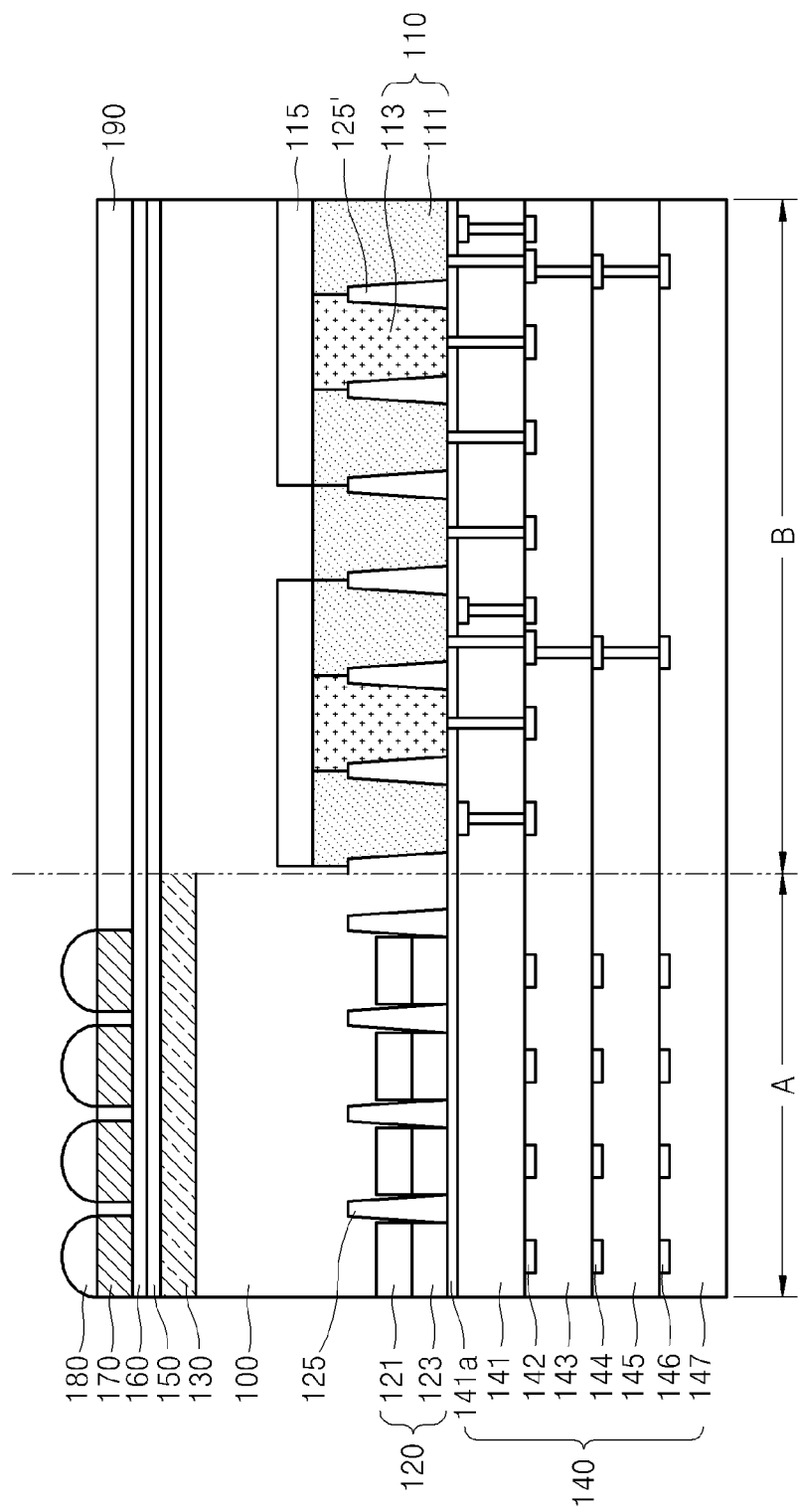
FIG. 4 is a cross-sectional view of the BSI CMOS image sensor of FIG. 2.

However, the BSI CMOS image sensor according to example embodiments may have a BSI structure as shown in FIG. 4. Thus, the above-described problems of the conventional FSI CMOS image sensor, that is, the absorption of light passing through the interconnection layer and the thick interlayer insulating layer or the sensitivity loss of the light and crosstalk due to great refraction of light, may be effectively solved. Furthermore, a wide bandgap material layer may be formed on a pixel array region, that is, a light incidence surface disposed over photodiodes, thereby improving sensitivity to blue light and further reducing crosstalk.

FIG. 4 is a cross-sectional view of the BSI CMOS image sensor of FIG. 2.

Referring to FIG. 4, a BSI CMOS image sensor according to example embodiments may include a semiconductor substrate 100, a photodiode 120, a wide bandgap material layer 130, an interconnection layer 140, an anti-reflective layer (ARL) 150, a passivation layer 160, a filter layer 170, and a microlens 180.

The semiconductor substrate 100 may be an epitaxial wafer, which may be a wafer obtained by growing a crystalline material on a single-crystalline silicon substrate. Although FIG. 4 illustrates a BSI CMOS image sensor including an epitaxial wafer as the semiconductor substrate 100, example embodiments of the inventive concepts are not limited thereto. Alternatively, various wafer examples, such as a polished wafer, an annealed wafer, or a SOI wafer, may be used as a substrate.

The semiconductor substrate 100 may be a $p^-$-type silicon substrate. When the $p^-$-type silicon substrate is grown, an epitaxial layer originally containing low-concentration p-type ions may be grown or p-type ions may be lightly doped into an epitaxial wafer.

The semiconductor substrate 100 may be divided into a pixel array region A where the photodiode 120 is formed and a peripheral circuit region B for processing signals.

In addition, an isolation layer 125 and 125' such as a STI region, a photodiode 120, and a well region 110 for a CMOS circuit may be formed in the semiconductor substrate 100. For example, the photodiode 120 may be formed in the semiconductor substrate 100 of the pixel array region A, while the well region 110 for the CMOS circuit may be formed in the semiconductor substrate 100 of the peripheral circuit region B. Also, the isolation layer 125 may be formed in an appropriate position to an appropriate thickness to electrically isolate respective devices from one another. The isolation layer may include a dielectric material that is an insulating material, such as an oxide, for example silicon dioxide, but example embodiments are not limited thereto. The oxide may be a thermal oxide or an oxide formed by a plasma-deposition process, but example embodiments are not limited thereto.

In particular, as shown in FIG. 4, the isolation layer 125 interposed between photodiodes 120 may be formed to a greater depth than other isolation layers 125' to reduce and/or prevent crosstalk between pixels. Alternatively, the isolation layer 125 between the photodiodes 120 may be formed to the same depth as other isolation layers 125'.

For reference, the BSI CMOS image sensor may have a BSI structure so that the filter layer 170 or microlens 180 to which light is incident may be formed on a rear surface of the semiconductor substrate 100 and the interconnection layer 140 required to process signals may be formed on a front surface of the semiconductor substrate 100. However, for brevity, FIG. 4 illustrates the rear surface of the semiconductor substrate 100 faces upward, while the front surface of the semiconductor substrate 100 faces downward. Thus, the above-described depth of the isolation layer 125 may be considered only in an upward direction from an insulating layer 141a.

While the photodiode 120 may be typically a visible-light photodiode configured to detect visible light, the photodiode 120 may include both the visible-light photodiode and an infrared (IR) photodiode configured to detect IR light as needed. The photodiode 120 may include a p-type upper semiconductor layer 121 (hereinafter referred to as the PPD region) and an n-type lower semiconductor layer 123 (hereinafter referred to as the NPD region), which may constitute a PN junction diode. The p-type impurity region (PPD region) and the n-type impurity region (NPD region) may have an intermediate dopant concentration, and the p-type impurity region may have a higher dopant concentration than the n-type impurity region.

In addition, a depletion region may be formed at a junction between the PPD region 121 and the NPD region 123 and expand due to an applied voltage. Also, the semiconductor substrate 100 (i.e., the p⁻-type silicon substrate) may function as a depletion region. As described above, the generation of electron-hole pairs may briskly occur in the depletion region.

A plurality of n-type wells 111 and a plurality of p-type wells 113 for CMOS circuits may be formed in the semiconductor substrate 100 of the peripheral circuit region B. Also, a deep n-type well 115 may be formed over the n/p/n-type well, which constitute a CMOS circuit centering on the p-type well 113. The deep n-type well 115 may be formed by implanting phosphorus (P) ions at an ion energy of about 1.4 MeV and a dopant concentration of about $4E^{13}$. The deep n-type well 115 may serve as a triple well configured to vary a driving voltage of a peripheral circuit.

An interconnection layer 140 may be formed under the semiconductor substrate 100. The interconnection layer 140 may include the insulating layer 141a, such as a gate insulating layer, a plurality of interlayer insulating layers 141, 143, 145, and 147, and metal interconnections 142, 144, and 146. A ground electrode (not shown) configured to apply a ground bias voltage may be formed in the semiconductor substrate 100.

Although not shown in FIG. 4, the interconnection layer 140 may include transistors configured to read signals and formed on the pixel array region A. For example, the interconnection layer 140 may include a transfer transistor, a select transistor, a drive transistor, and a reset transistor. Also, the interconnection layer 140 may include a plurality of transistors, a plurality of gate lines, and a plurality of source lines, which may be provided in the peripheral circuit region B and constitute CMOS circuits configured to process signals.

The wide bandgap material layer 130 may be formed on a top surface of the semiconductor substrate 100 of the pixel array region A. As mentioned above, when a front-surface structure of the CMOS image sensor is shown unlike in FIG. 4, the wide bandgap material layer 130 may be disposed on a bottom surface of the semiconductor substrate 100. The wide bandgap material layer 130 may be a material layer, such as a silicon-based material layer, which may have a wide energy bandgap and a low absorption coefficient with respect to blue light. The wide bandgap material layer 130 may be formed of, for example, SiC, SiN, or SiCN. In particular, when the wide bandgap material layer 130 is formed of SiC, the wide bandgap material layer 130 may have a very wide energy bandgap of about 2 to 6 eV according to a crystalline structure.

By use of the wide bandgap material layer 130, the BSI CMOS image sensor may improve sensitivity to blue light and reduce crosstalk as described above. The effects of the wide bandgap material layer 130 will be described in more detail later with reference to FIGS. 6 through 10. The wide bandgap material layer 130 may be formed on the entire pixel array region A or only in a portion corresponding to specific pixels, that is, blue pixels, as described below with reference to FIGS. 14A and 14B.

The ARL 150 may be formed on the wide bandgap material layer 130. The ARL 150 may prevent reflection of incident light and allow most light to be transmitted through the photodiode 120, thereby improving the light receptivity of the BSI CMOS image sensor. Although FIG. 4 illustrates that the ARL 150 is formed also in the peripheral circuit region B, the ARL 150 may be formed only in the pixel array region A to increase functional effects.

The ARL 150 may be referred to as a bottom anti-reflective layer (BARL) in that the ARL 150 is formed under the microlens 180 and the filter layer 170 to which light is incident. The ARL 150 may be a single layer or a plurality of layers as described below with reference to FIGS. 15A through 15D.

The passivation layer 160 may be formed on the ARL 150. The passivation layer 160 may be an insulating layer configured to physically and chemically protect the BSI CMOS image sensor. For example, the passivation layer 160 may be formed of silicon oxide ($SiO_2$).

The filter layer 170 may be formed on the passivation layer 160 of the pixel array region A and include filters corresponding to underlying photodiodes 120. For example, red (R), green (G), and blue (B) filters may be formed to respectively correspond to photodiodes of R, G, and B pixels. While FIG. 4 illustrates a filter layer 170 including (R), green (G), and blue (B) filters, example embodiments are not limited thereto. For example, Red (R), yellow (Ye), and white (W) filters may be formed instead of the R, G, and B filters as needed. When the BSI CMOS image sensor includes an IR photodiode, an IR filter corresponding to the IR photodiode may be provided.

The passivation layer 160 and a planarization layer 190 may be formed on the interconnection layer 140 of the peripheral circuit region B.

A plurality of microlenses 180 corresponding to respective filters may be formed on the filter layer 170. The microlenses 180 may collect light and allow the light to be incident to the corresponding photodiodes 120.

A BSI CMOS image sensor according to example embodiments may have a BSI structure in which light is incident to the rear surface of the semiconductor substrate 100, that is, in an opposite direction to the front surface of the semiconductor substrate 100. Also, the wide bandgap material layer 130 may be formed on the semiconductor substrate 100 toward which light is incident. Thus, the BSI CMOS image sensor according to example embodiments may solve the absorption of light, the loss of light sensitivity, and crosstalk caused by great reflection of light, based on a BSI structure. Furthermore, the BSI CMOS image sensor of example embodiments may improve sensitivity to blue light and further reduce crosstalk due to the wide bandgap material layer 130.

Figure 5A:
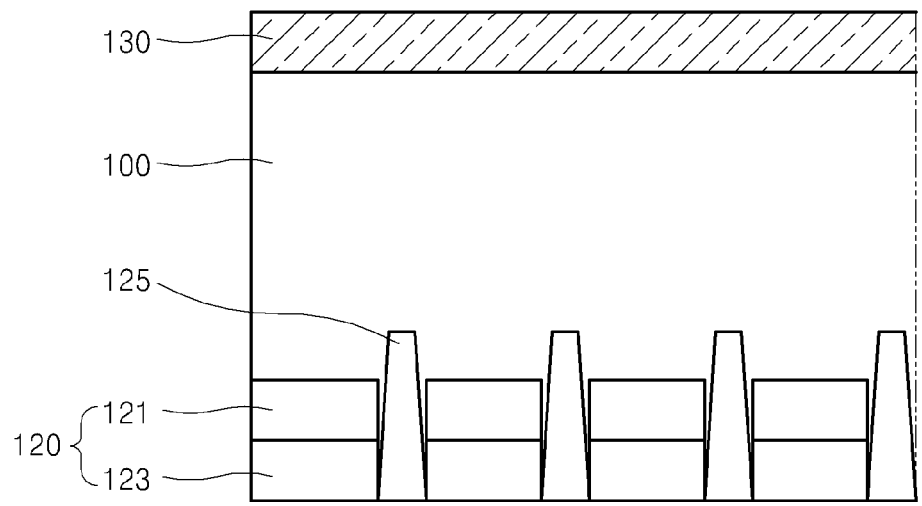
FIGS. 5A and 5B are detailed cross-sectional views of wide bandgap material layer of BSI CMOS image sensors as of FIG. 2.
Figure 5B:
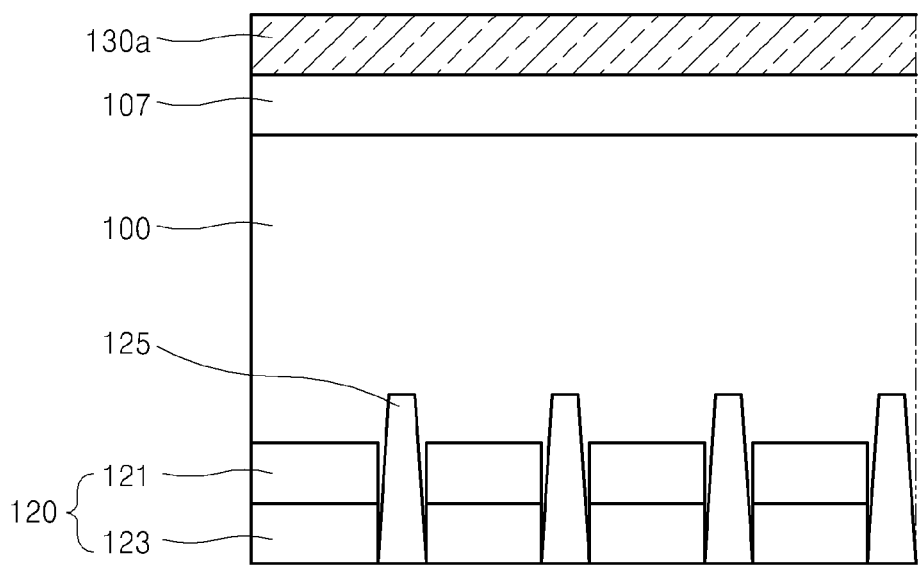

FIGS. 5A and 5B are detailed cross-sectional views of wide bandgap material layers 130 and 130a of BSI CMOS image sensors as in FIG. 2.

Referring to FIGS. 5A and 5B, the photodiode 120 and the isolation layer 125 may be formed in the semiconductor substrate 100, and the wide bandgap material layer 130 or 130a may be formed on the semiconductor substrate 100. However, the wide bandgap material layers 130 and 130a of the BSI CMOS image sensors of FIGS. 5A and 5B may be formed in different positions.

The BSI CMOS image sensor of FIG. 5A may include the wide bandgap material layer 130 formed directly on the semiconductor substrate 100, while the BSI CMOS image sensor of FIG. 5B may include a $p^+$-type silicon layer 107 formed on the semiconductor substrate 100 and the wide bandgap material layer 130a formed on the $p^+$-type silicon layer 107.

The $p^+$-type silicon layer 107 may be formed on a front surface of the semiconductor substrate 100 to reduce the resistance of the semiconductor substrate 100. However, the $p^+$-type silicon layer 107 may increase the loss of blue light and electron leakage, thereby reducing the sensitivity of the BSI CMOS image sensor to blue light and increasing crosstalk. However, by forming the wide bandgap material layer 130a on the $p^+$-type silicon layer 107, as shown in FIG. 5B, the above-described problems may be solved.

The effects of the wide bandgap material layers 130 and 130a shown in FIGS. 5A and 5B will be described in more detail with reference to FIGS. 6 through 10. Also, methods of forming the wide bandgap material layers 130 and 130a of FIGS. 5A and 5B will be described in more detail with reference to FIGS. 11A through 12F.

Figure 6:
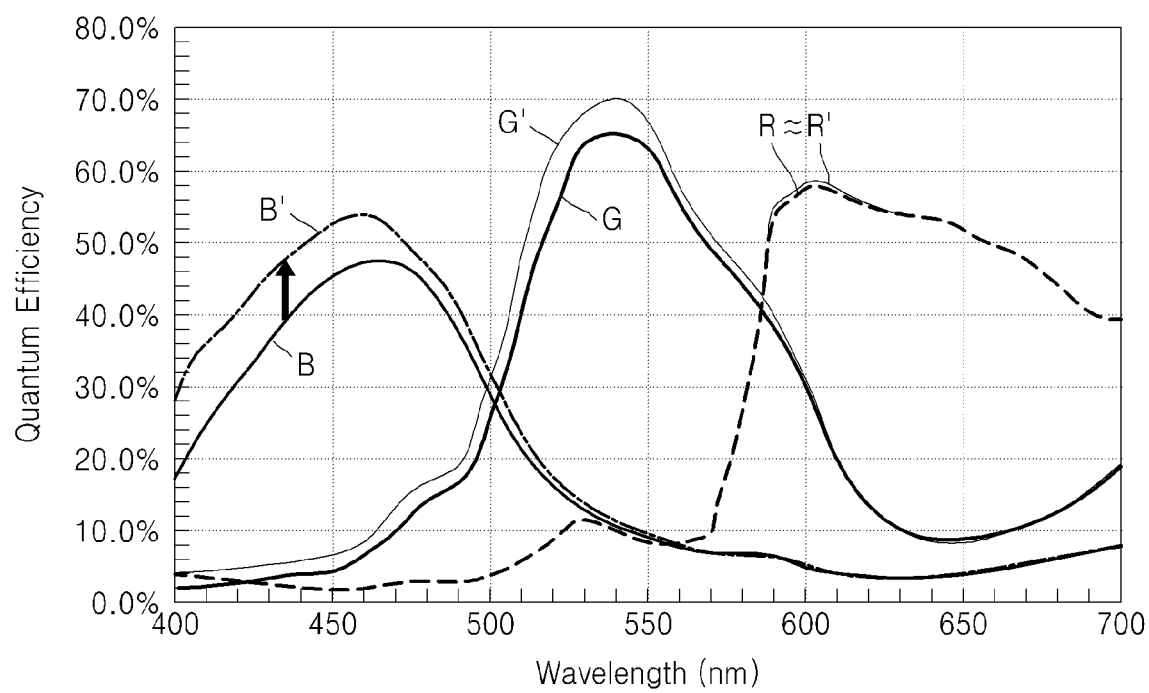
FIG. 6 is a graph showing quantum efficiency relative to wavelength in a BSI CMOS image sensor using the wide bandgap material layer of FIG. 5A or FIG. 5B.

FIG. 6 is a graph showing quantum efficiency relative to wavelength in the BSI CMOS image sensor using the wide bandgap material layer 130 or 130a of FIG. 5A or FIG. 5B.

Referring to FIG. 6, curves B, G, and R show quantum efficiencies relative to the wavelengths of B, G, and R light in a CMOS image sensor without a wide bandgap material layer, while curves B', G', and R' show quantum efficiencies relative to the wavelengths of B, G, and R light in a CMOS image sensor having a wide bandgap material layer.

As can be seen from FIG. 6, due to the use of the wide bandgap material layer, quantum efficiency may increase by as much as almost 10% in a blue wavelength range of about 400 to 600 nm as denoted by a thick arrow. Also, quantum efficiency may increase in a green wavelength range of 550 nm or less. It can be seen that quantum efficiency is hardly affected by the wide bandgap material layer in a red wavelength range.

An increase in quantum efficiency refers to an increase in the number of photons used to generate electron-hole pairs. Thus, the use of the wide bandgap material layer may lead to an increase in the electron-hole pairs with respect to incident blue light. As a result, the sensitivity of the CMOS image sensor to blue light may increase. The wide bandgap material layer may increase the sensitivity of the CMOS image sensor to green light.

Figure 7:
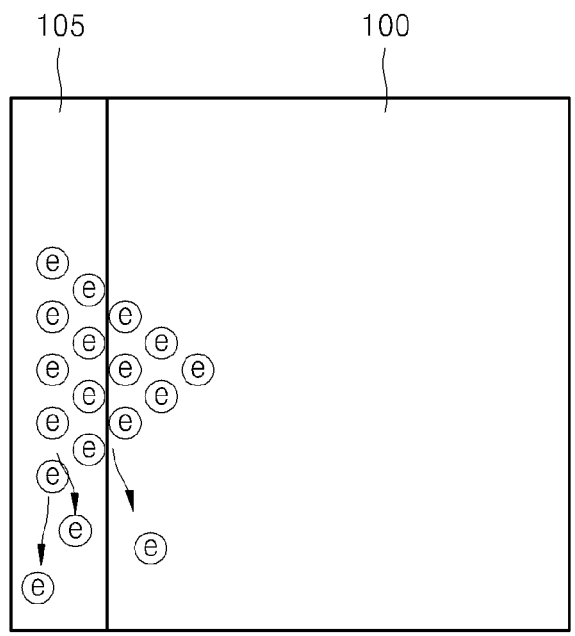
FIGS. 7 (a) and (b) are conceptual diagrams showing a principle by which the sensitivity of the CMOS image sensor to blue light is improved using the wide bandgap material layer of FIG. 5A.
Figure 7:
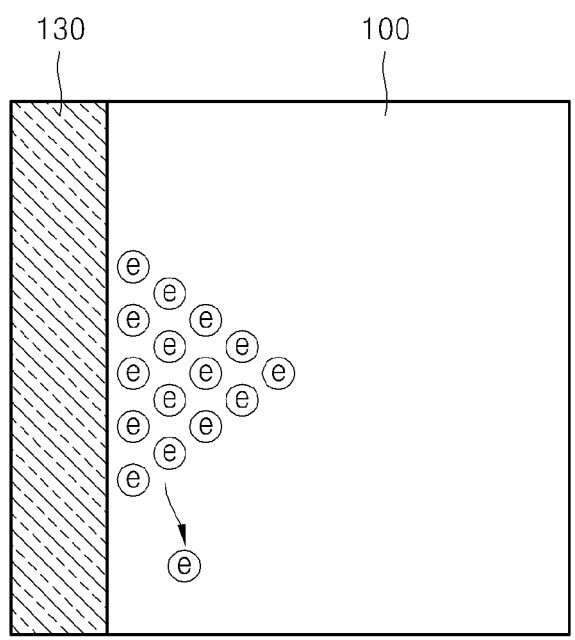

FIGS. 7 (a) and (b) are conceptual diagrams showing a principle by which the sensitivity of the CMOS image sensor to blue light is improved using the wide bandgap material layer of FIG. 5A. FIG. 7 (a) shows a conventional structure in which a $p^+$-type silicon layer is formed on a semiconductor substrate and FIG. 7b shows a structure in which a wide bandgap material layer is formed instead of the $p^+$-type silicon layer.

Referring to FIG. 7 (a), in the conventional structure, incident blue light is absorbed by or transmitted through the $p^+$-type silicon layer 105 and easily leaked, although contributing to the generation of electron-hole pairs. The absorbed or leaked photons or electrons may act as crosstalk factors. An arrow of FIG. 7 (a) denotes the leaked photons or electrons.

In contrast, in the structure of FIG. 7 (b) including the wide bandgap material layer 130, most photons may be transmitted through the wide bandgap material layer 130 and incident to the $p^-$-type silicon substrate 100. Thus, the CMOS image sensor may improve sensitivity to blue light, increase a SNR, and reduce crosstalk. Thus, in view of the fact that the absorbed or leaked photons or electrons function as noise, the wide bandgap material layer 130 according to example embodiments can reduce noise to increase the SNR.

Figure 8:
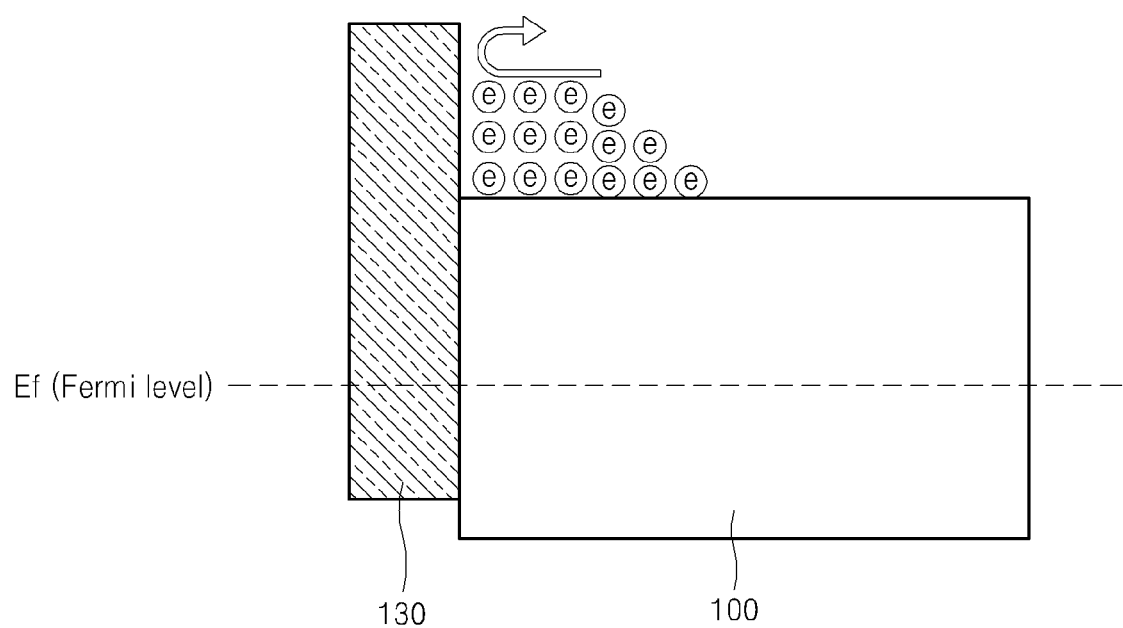
FIG. 8 is a conceptual diagram showing a principle by which crosstalk is reduced and/or prevented in a BSI CMOS image sensor using the wide bandgap material layer of FIG. 5A.

FIG. 8 is a conceptual diagram showing a principle by which crosstalk is reduced and/or prevented in a CMOS image sensor using the wide bandgap material layer 130 of FIG. 5A.

Referring to FIG. 8, the wide bandgap material layer 130 has a higher energy level than the $p^-$-type silicon substrate 100. Thus, the wide bandgap material layer 130 may function as a built-in potential in the BSI CMOS image sensor of example embodiments. That is, the wide bandgap material layer 130 may reduce and/or prevent the leakage of electrons produced due to the generation of electron-hole pairs. Accordingly, the wide bandgap material layer 130 may reduce and/or prevent the leakage of the produced electrons, thereby further inhibiting crosstalk. Here, (e) may be interpreted as electrons produced due to the generation of the electron-hole pairs.

Figure 9:
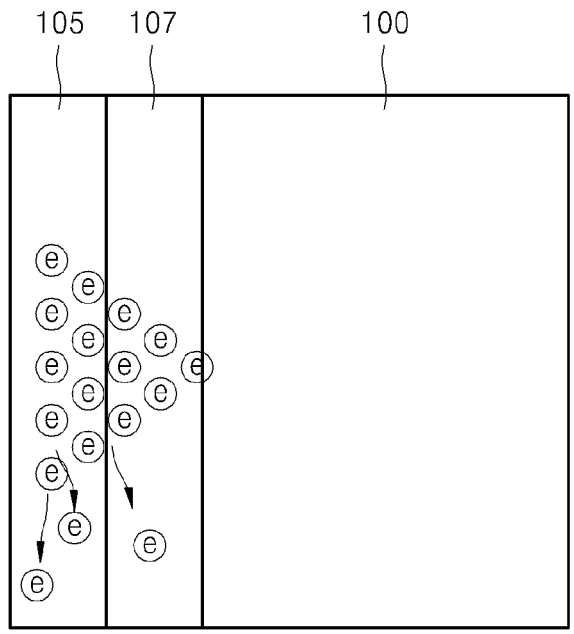
FIGS. 9 (a) and (b) are conceptual diagrams showing a principle by which the sensitivity of the CMOS image sensor to blue light is improved using the wide bandgap material layer of FIG. 5B.
Figure 9:
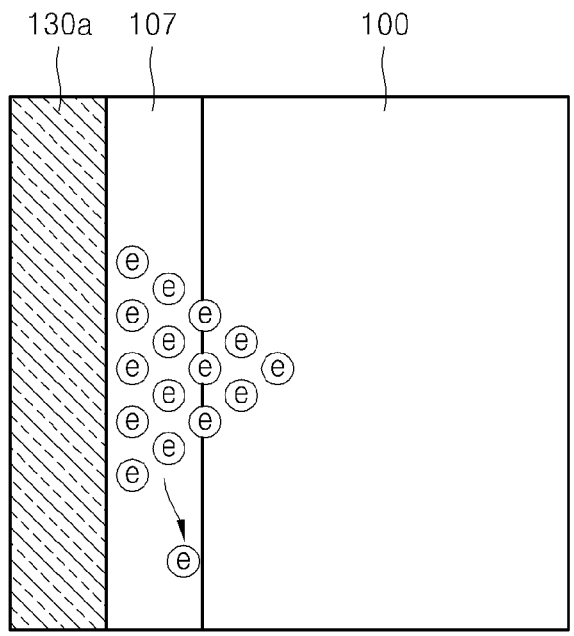

FIGS. 9 (a)A and 9B are conceptual diagrams showing a principle by which the sensitivity of the CMOS image sensor to blue light is improved using the wide bandgap material layer of FIG. 5B. FIG. 9 (a) shows a conventional structure in which a p+-type silicon double layer is formed on a semiconductor substrate and FIG. 9 (b) shows a structure in which a $p^+$-type silicon layer and a wide bandgap material layer are formed on a semiconductor substrate.

Referring to FIG. 9 (a), in the conventional structure, a $p^+$-type silicon double layer 105 and 107 may be formed on a $p^-$-type silicon substrate 100. A $p^+$-type silicon upper layer 105 of the $p^+$-type silicon double layer 105 and 107 may have a higher dopant concentration than a $p^+$-type silicon lower layer 107. For example, the $p^+$-type silicon upper layer 105 may have a dopant concentration of about $1E^{15}$, and the $p^+$-type silicon lower layer 107 may have a dopant concentration of about $1E^{14}$. Also, the p$^+$-type silicon upper layer 105 may serve the same function as the p$^+$-type silicon layer 105 of FIG. 7.

As in FIG. 7 (a), in the conventional structure of FIG. 9 (a), incident blue light is absorbed by the p$^+$-type silicon upper layer 105 of the p$^+$-type silicon double layer 105 and 107 and leaked. In contrast, in the structure of FIG. 9 (b) in which the wide bandgap material layer 130 is formed on the p$^+$-type silicon lower layer 107, most photons may pass through the wide bandgap material layer 130a and be incident to the p$^+$-type silicon lower layer 107 and the p$^-$-type silicon substrate 100, thereby contributing to the generation of electron-hole pairs. As a result, the structure according to example embodiments can improve sensitivity to blue light due to the wide bandgap material layer 130, increase SNR, and reduce crosstalk.

Figure 10:
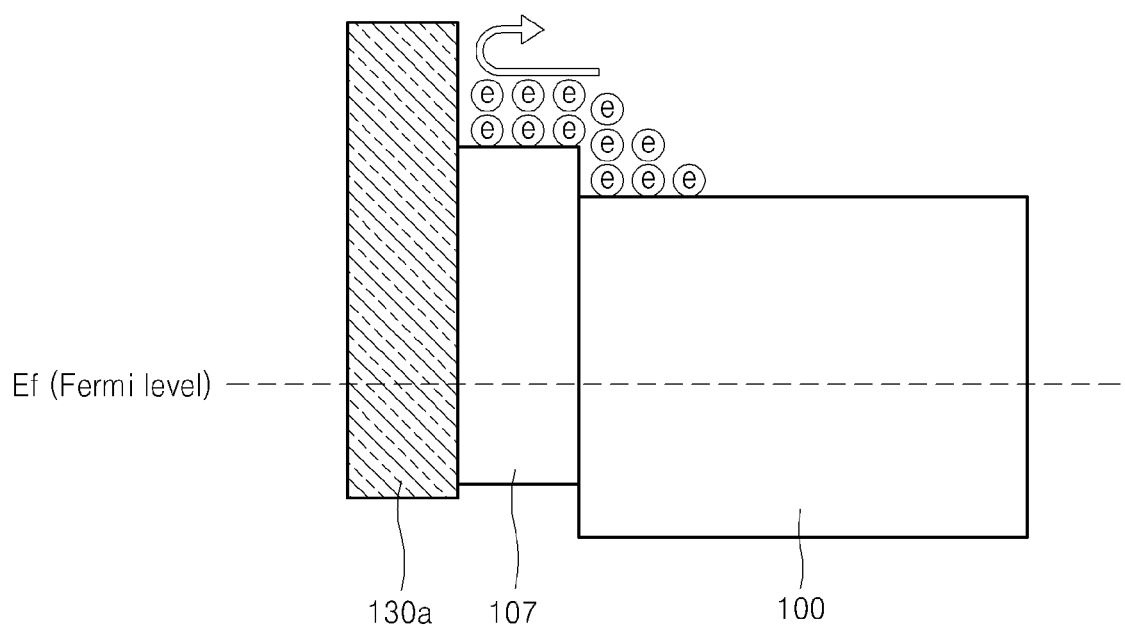
FIG. 10 is a conceptual diagram showing a principle by which principle by which crosstalk is reduced and/or prevented in the BSI CMOS image sensor using the wide bandgap material layer of FIG. 5B.

FIG. 10 is a conceptual diagram showing a principle by which principle by which crosstalk is reduced and/or prevented in the CMOS image sensor using the wide bandgap material layer 130a of FIG. 5B.

Referring to FIG. 10, an energy level of the wide bandgap material layer 130a may be higher than energy levels of the p$^+$-type silicon lower layer 107 and the p$^-$-type silicon substrate 100. Thus, the wide bandgap material layer 130a may function as a built-in potential in the BSI CMOS image sensor of example embodiments. Accordingly, in the BSI CMOS image sensor of example embodiments, the wide bandgap material layer 130a may function to reduce and/or prevent the leakage of generated electrons, thereby further contributing to preventing crosstalk. For reference, an energy level of the p$^+$-type silicon lower layer 107 may be higher than an energy level of the p$^-$-type silicon substrate 100, but not so high as to help reduce and/or prevent the leakage of electrons.

FIGS. 11A through 11D are cross-sectional views illustrating a method of forming the wide bandgap material layer 130 in the BSI CMOS image sensor including the wide bandgap material layer 130 of FIG. 5A.

Figure 11A:
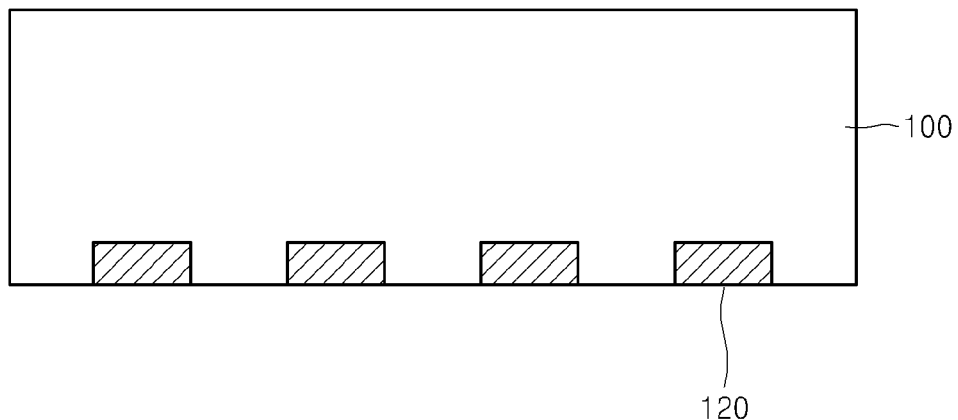
FIGS. 11A through 11D are cross-sectional views illustrating a method of forming a wide bandgap material layer in the BSI CMOS image sensor using the wide bandgap material layer of FIG. 5A.

Referring to FIG. 11A, initially, a photodiode 120 and an isolation layer 125 may be formed in a semiconductor substrate 100, and an interconnection layer 140 may be formed on the lower surface of the semiconductor substrate 100. For brevity, FIG. 11A illustrates only a pixel array region and the photodiode 120, while the interconnection layer 140 and the isolation layer 125 are omitted. Here, the semiconductor substrate 100 may be a p$^-$-type silicon substrate.

Figure 11B:
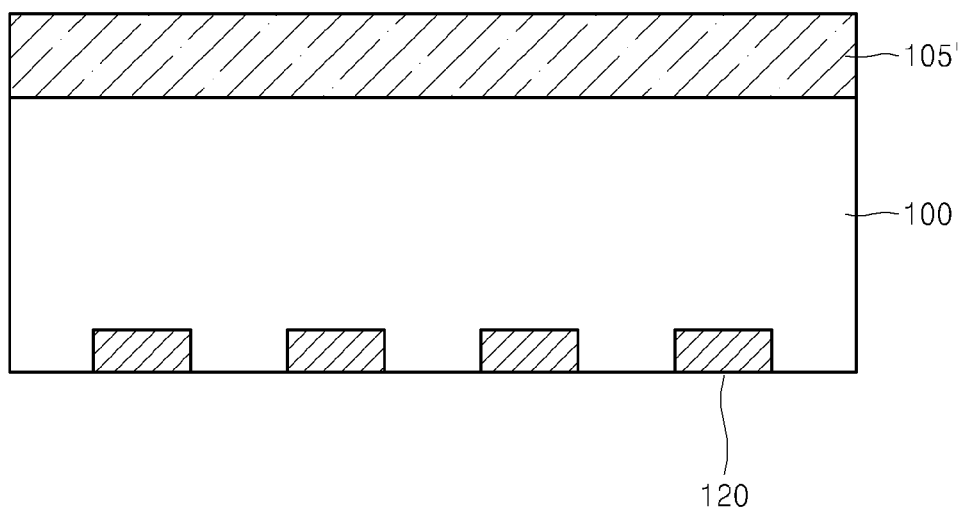

Referring to FIG. 11B, boron (B) may be doped into the semiconductor substrate 100, thereby forming a p$^+$-type silicon layer 105'. For example, the p$^+$-type silicon layer 105' may have a dopant concentration of about $1E^{15}$. Here, IIP refers to an ion implantation process. While boron may be used to dope the semiconductor substrate using an ion implantation process, example embodiments are not limited thereto and alternative p-type dopants and/or doping processes may be used.

Figure 11C:
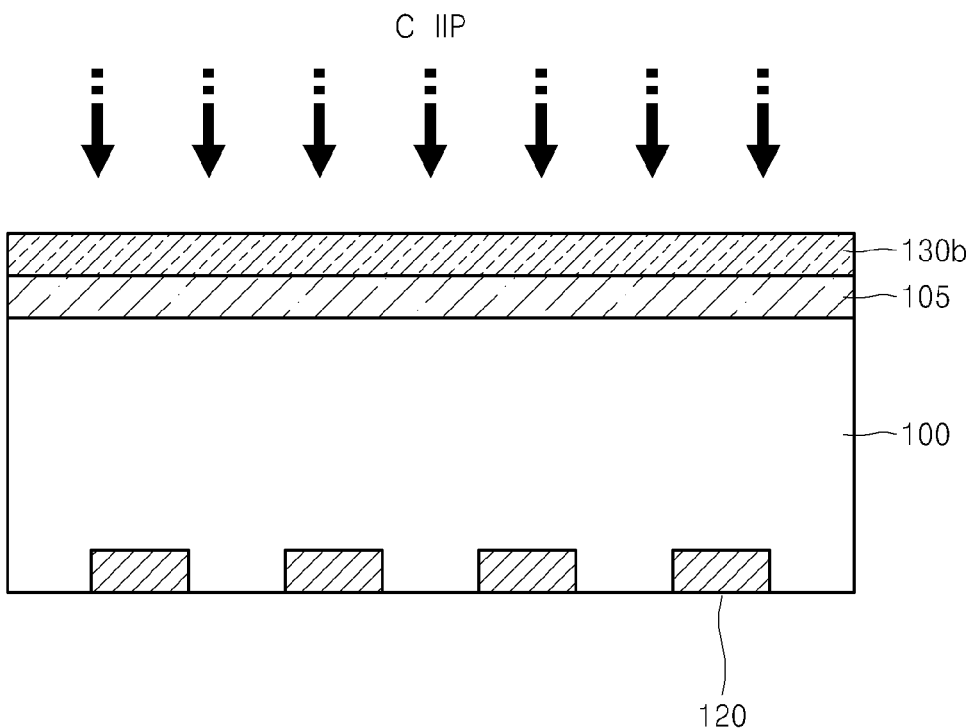

Referring to FIG. 11C, carbon (C) may be doped into an upper region of the p$^+$-type silicon layer 105', thereby forming a SiC layer 130b and p$^+$-type silicon layer 105. The dopant concentration of C may depend on the thickness and crystalline structure of a desired SiC layer. Also, the dopant concentration of C may be determined in consideration of a subsequent annealing process. The p$^+$-type silicon layer 105 may have a dopant concentration of about $1E^{15}$.

Figure 11D:
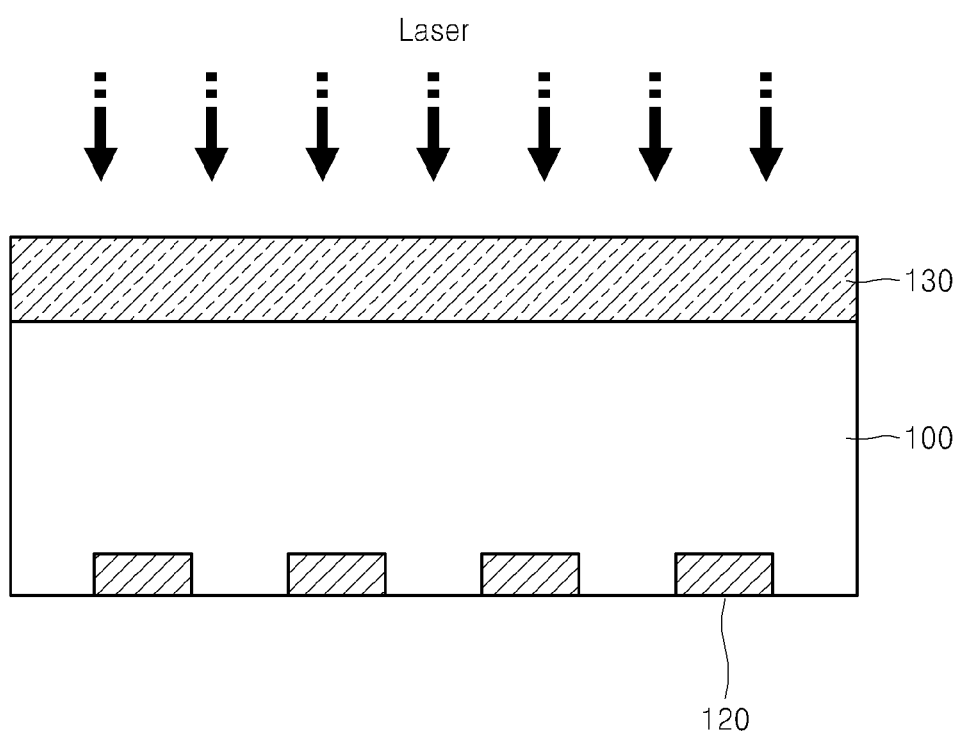

Referring to FIG. 11D, a p$^+$-SiC layer 130 may be formed using a annealing process, for example a laser annealing process but example embodiments are not limited thereto. Due to the laser annealing process, C may diffuse from the SiC layer 130b into the underlying p$^+$-type silicon layer 105, and thus, the initial p$^+$-type silicon layer 105 may be converted into the p$^+$-SiC layer 130, which may form the wide bandgap material layer 130 of FIG. 5A. The laser annealing process may be performed using, for example, a $CO_2$ laser pulse process, which will be described below with reference to FIG. 13.

In example embodiments, the p$^+$-type SiC layer 130 may be obtained by implanting C ions. When the p$^+$-type SiC layer 130 is formed using a deposition process, the interconnection layer 140 formed on the lower surface of the semiconductor substrate 100 may be damaged due to a high-temperature deposition process. Also, a SiC layer may be formed only in a desired region by an ion implantation process using a predetermined mask.

FIGS. 12A through 12F are cross-sectional views illustrating a method of forming the wide bandgap material layer 130b in the BSI CMOS image sensor including the wide bandgap material layer 130b of FIG. 5B.

Figure 12A:
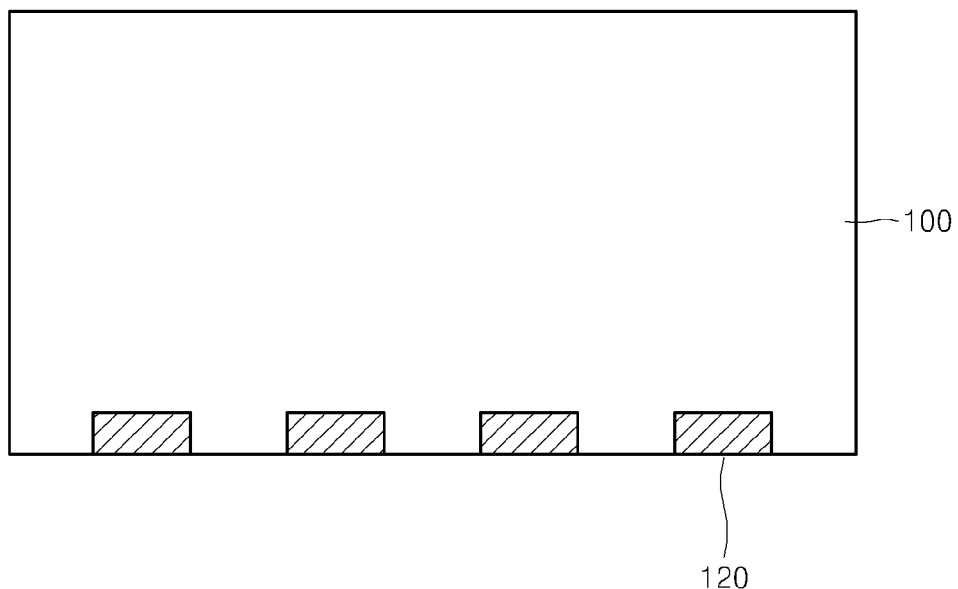
FIGS. 12A through 12F are cross-sectional views illustrating a method of forming a wide bandgap material layer in the CMOS image sensor using the wide bandgap material layer of FIG. 5B.

Referring to FIG. 12A, initially, a photodiode 120 and an isolation layer 125 may be formed in a semiconductor substrate 100, and an interconnection layer 140 may be formed on the lower surface of the semiconductor substrate 100. Similarly, for brevity, FIG. 12A illustrates a pixel array region and the photodiode 120, while the interconnection layer 140 and the isolation layer 125 are omitted. Here, the semiconductor substrate 100 may be a p$^-$-type silicon substrate.

Figure 12B:
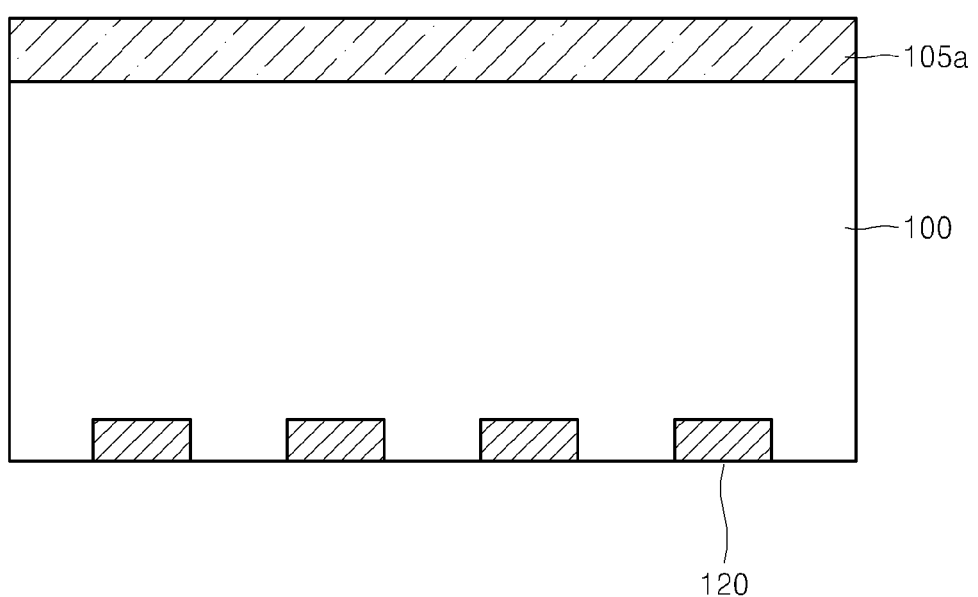

Referring to FIG. 12B, B may be doped into the semiconductor substrate 100, thereby forming a first p$^+$-type silicon layer 105a.

Figure 12C:
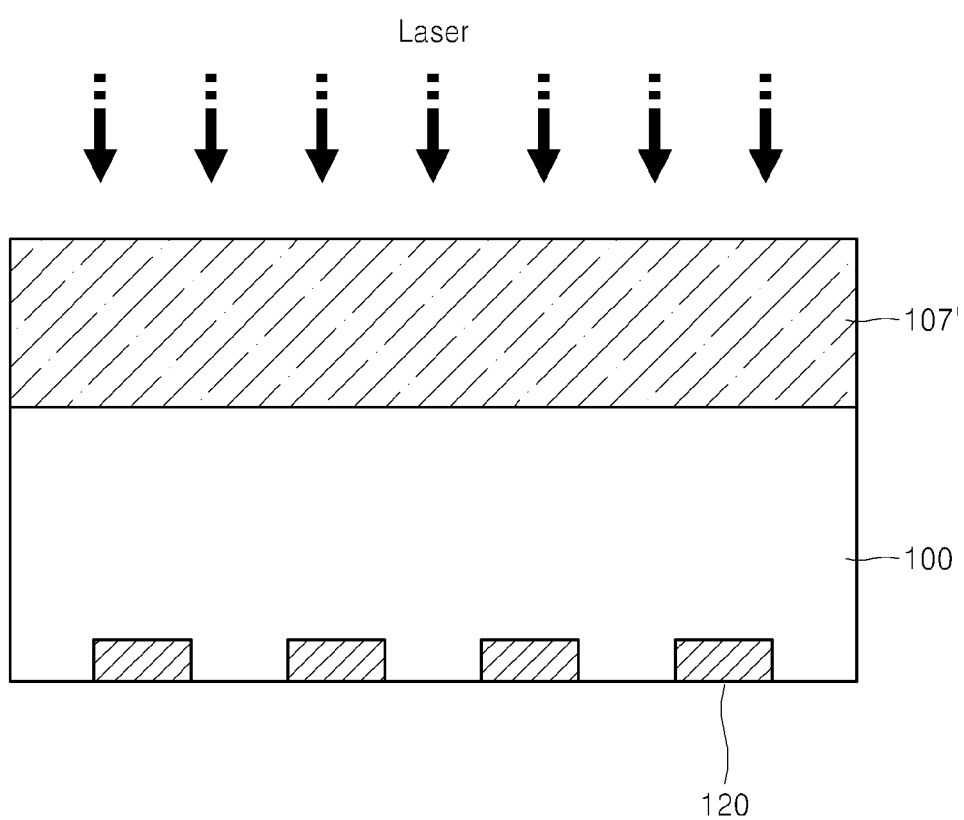

Referring to FIG. 12C, a second p$^+$-type silicon layer 107 may be formed using a laser annealing process. Due to the laser annealing process, B may diffuse from the first p$^+$-type silicon layer 105a into the semiconductor substrate 100, thereby forming the second p$^+$-type silicon layer 107'. Thus, the second p$^+$-type silicon layer 107 may have a greater thickness and a lower dopant concentration than the first p$^+$-type silicon layer 105a.

Figure 12D:
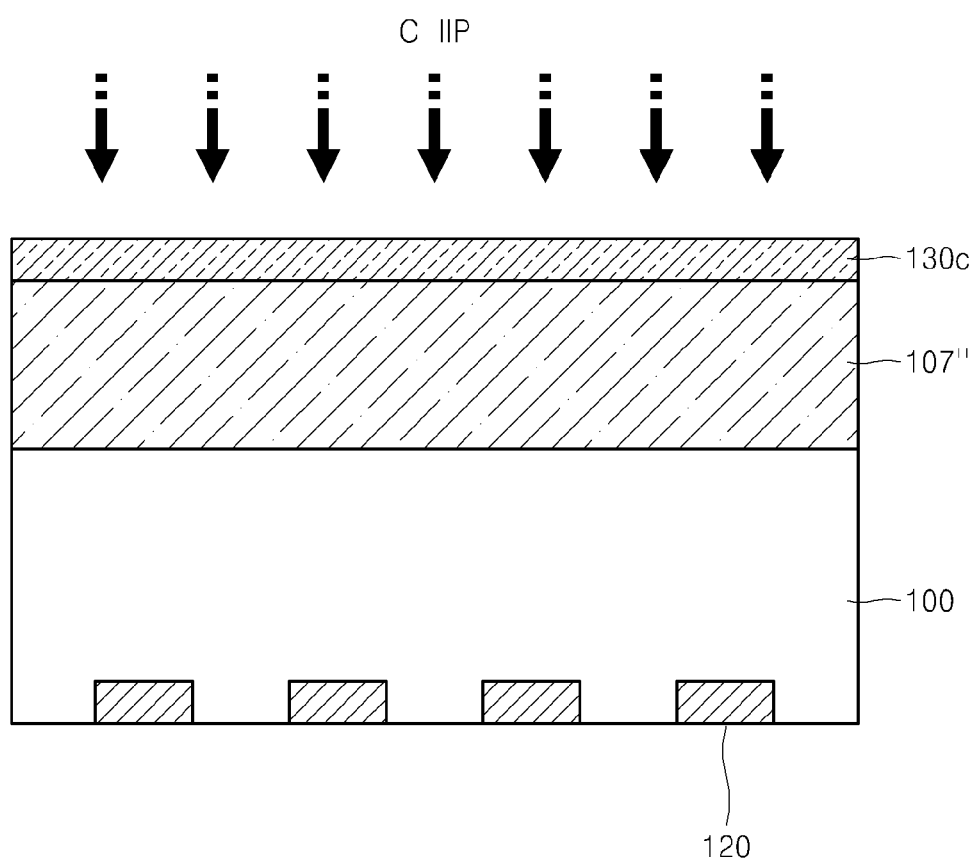

Referring to FIG. 12D, C may be doped into an upper region of the second p$^+$-type silicon layer 107', thereby forming a SiC layer 130c and second p$^+$-type silicon layer 107''. The dopant concentration of C may depend on the thickness and crystalline structure of a desired SiC layer. Also, the dopant concentration of C may be determined in consideration of a subsequent laser annealing process.

Figure 12E:
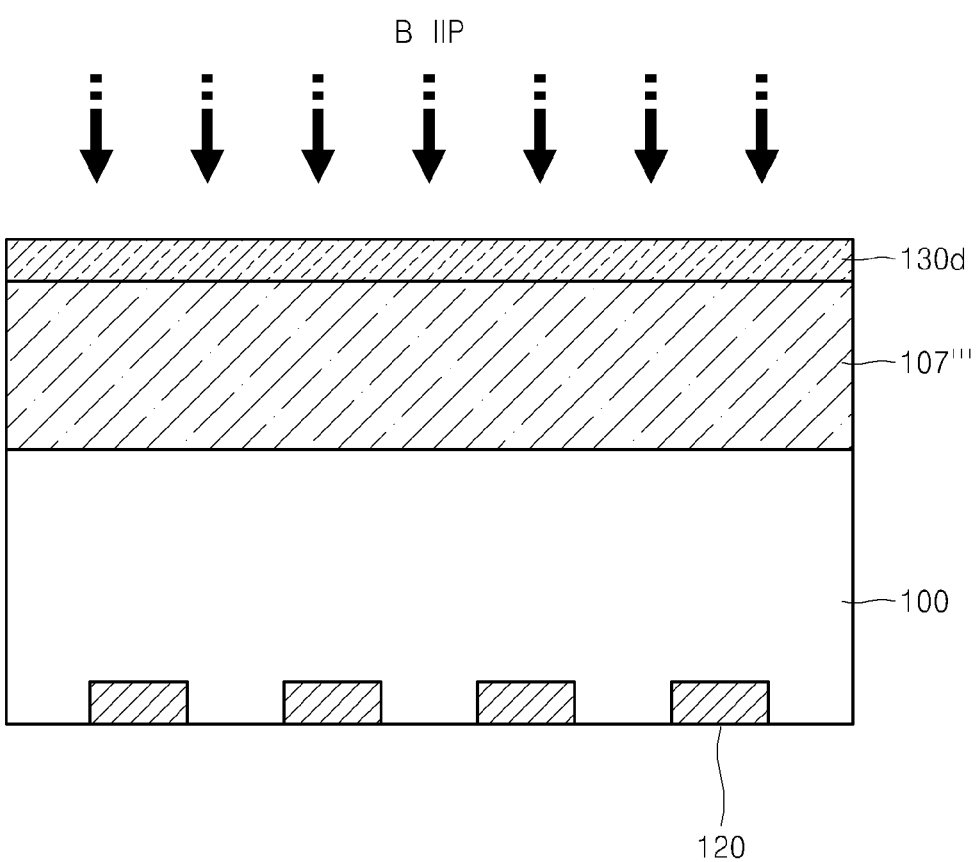

Referring to FIG. 12E, B may be doped into the SiC layer 130c, thereby forming a first p$^+$-type SiC layer 130d and p$^+$-type silicon layer 107'''. Here, B may be doped to supplement the dopant concentration of the second p$^+$-type silicon layer 107'' because the dopant concentration of the second p$^+$-type silicon layer 107'' may be lower than that of the first p$^+$-type silicon layer 105a.

Figure 12F:
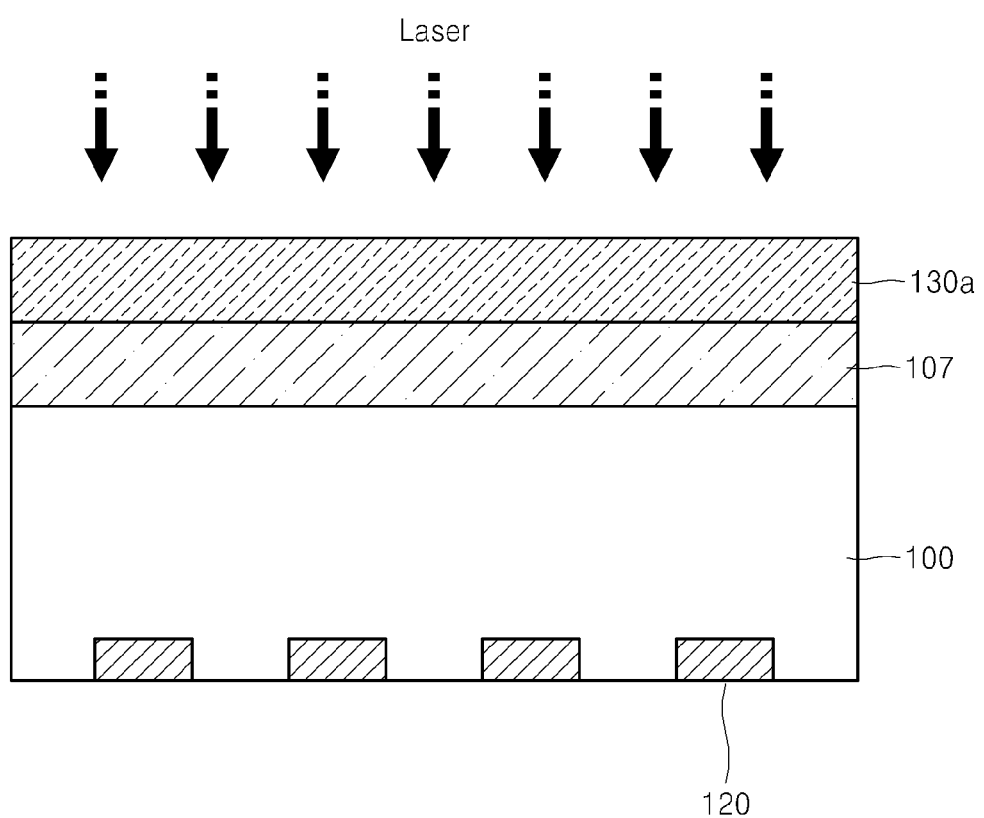

Referring to FIG. 12F, a second p$^+$-type SiC layer 130a may be formed using a laser annealing process. Due to the laser annealing process, C and B may diffuse from the first p$^+$-type SiC layer 130d into the underlying second p$^+$-type silicon layer 107''' and form second p$^+$-type silicon layer 107 as a result, and thus, a partial upper region of the second p$^+$-type silicon layer 107''' may be converted into the second p$^+$-type SiC layer 130a and second p$^+$-type silicon layer 107 results. As a result, an upper region corresponding to about half the thickness of the initial second p$^+$-type silicon layer 107' may be converted into the second p$^+$-type SiC layer 130a. The second p$^+$-type SiC layer 130a may form the wide bandgap material layer 130a of FIG. 5B.

Figure 13:
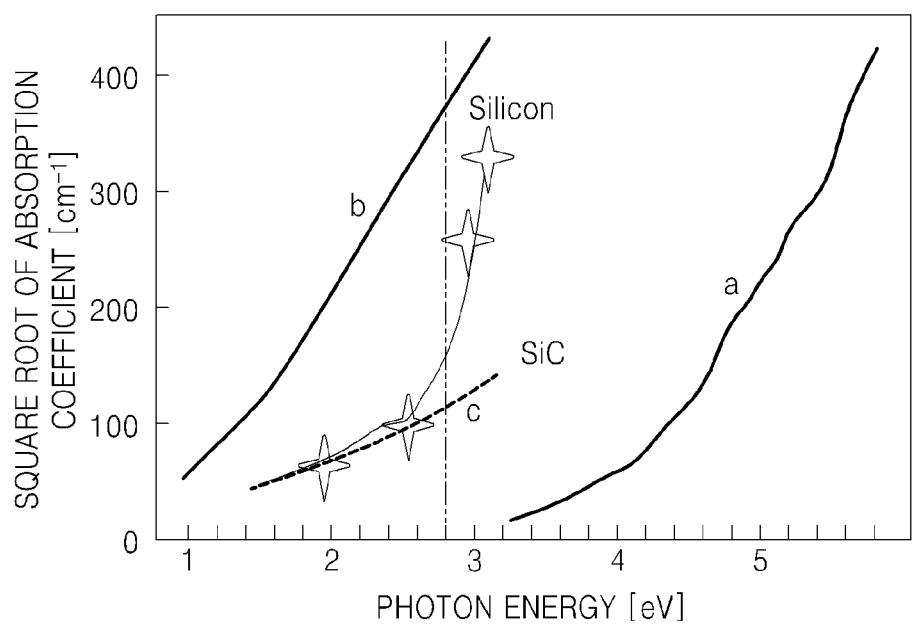
FIG. 13 is a graph showing the absorption coefficients of monocrystalline silicon carbide, doped amorphous silicon carbide, and $CO_2$-laser-annealed silicon carbide.

FIG. 13 is a graph showing the absorption coefficients of monocrystalline silicon carbide, doped amorphous silicon carbide, and $CO_2$-laser-annealed silicon carbide.

Referring to FIG. 13, curve a shows the absorption coefficient of monocrystalline silicon carbide (6H-SiC) relative to photon energy, curve b shows the absorption coefficient of doped amorphous silicon carbide relative to photon energy, and curve c shows the absorption coefficient of $CO_2$-laser-annealed silicon carbide relative to photon energy. A curve marked with asterisks is a comparative curve showing the absorption coefficient of silicon relative to photon energy. An ordinate denotes a square root of an absorption coefficient.

As shown in FIG. 13, it can be confirmed that the absorption coefficient of silicon sharply increased at a photon energy of about 2.8 eV. Also, curve a shows that 6H-SiC mainly absorbs a photon energy of about 3 eV or higher, and curve b shows that doped silicon carbide mainly absorbs a photon energy of about 3 eV or lower.

Curve c shows that CO2-laser-annealed silicon carbide shows a very low absorption coefficient over the entire area. Thus, it can be seen that CO2-laser-annealed silicon carbide absorbs very low photon energy. In this case, light is not absorbed by but transmitted through CO2-laser-annealed silicon carbide. Thus, the light reception efficiency of light energy incident to a photodiode may be increased. As a result, from FIG. 13, it can be understood that the process of FIG. 11D or FIG. 12F needs a laser annealing process.

Figure 14A:
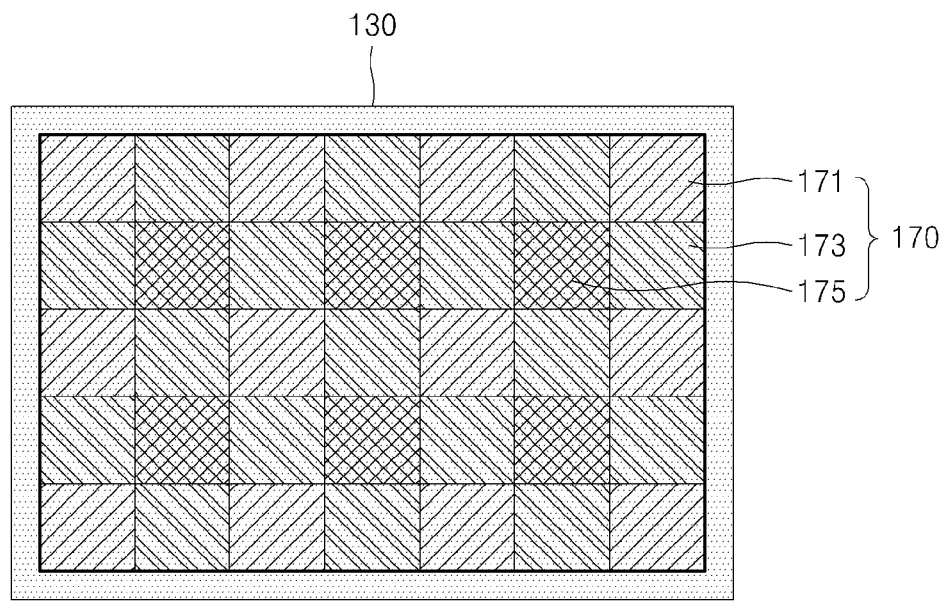
FIGS. 14A and 14B are plan views of wide bandgap material layers formed in pixel array regions of BSI CMOS image sensors using a wide bandgap material layer according to example embodiments of the inventive concepts.
Figure 14B:
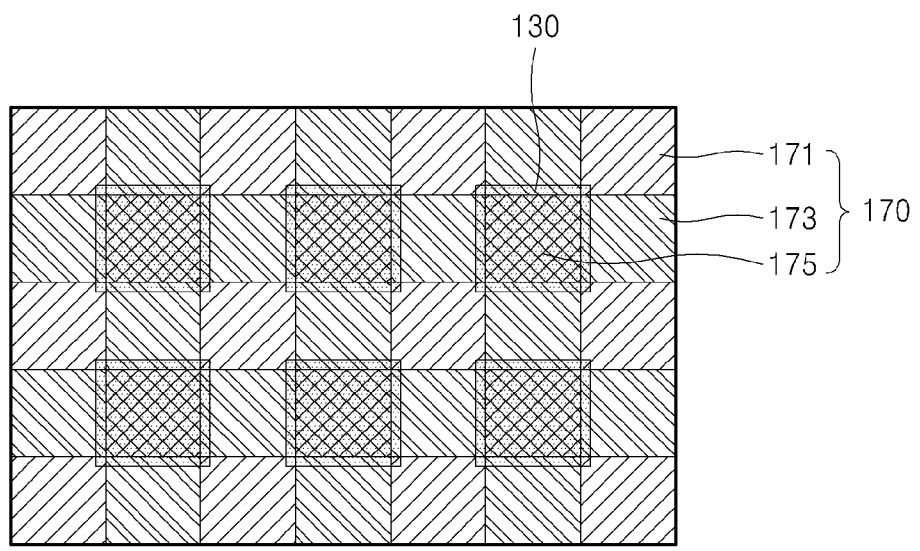

FIGS. 14A and 14B are plan views of wide bandgap material layers formed in pixel array regions of BSI CMOS image sensors according to example embodiments of the inventive concepts.

FIG. 14A shows a BSI CMOS image sensor in which a wide bandgap material layer 130 is formed on the entire pixel array region, according to example embodiments. Alternatively, FIG. 14B shows a BSI CMOS image sensor in which a wide bandgap material layer 130 is formed only in a portion corresponding to a blue pixel of a pixel array region, according to example embodiments.

The pixel array region may be divided into three kinds of pixels according to color filters of the filter layer 170. For example, the pixel array region may include an R pixel corresponding to a red filter 171, a G pixel corresponding to a green filter 173, and a B pixel corresponding to a blue filter 175.

As shown in FIG. 14B, the wide bandgap material layer 130 may be formed only under a blue filter corresponding to the B pixel, thereby reducing white spots. As described above, the wide bandgap material layer 130 may be formed only in a required region using an ion implantation process. For instance, as shown in FIG. 11C or FIG. 12D, C ions may be doped only into a required region, thereby forming a SiC layer.

FIGS. 15A through 15D are cross-sectional views illustrating ARLs 150a, 150b, 150c, and 150d in a BSI CMOS image sensor including a wide bandgap material layer 130 according to example embodiments of the inventive concepts.

Figure 15A:
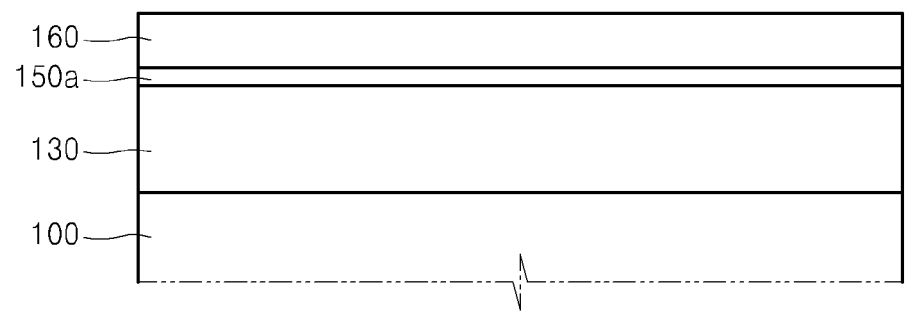
FIGS. 15A through 15D are cross-sectional views of anti-reflective layers (ARLs) in a BSI CMOS image sensor using a wide bandgap material layer according to example embodiments of the inventive concepts.

Referring to FIG. 15A, in example embodiments, the ARL 150a may be formed on the wide bandgap material layer 130 as a single layer. For example, the wide bandgap material layer 130 may be formed of $p^+$-type SiC, and the ARL 150a may be formed of silicon nitride ($SiN_x$). The passivation layer 160 may be formed of $SiO_2$ on the ARL 150a.

Figure 15B:
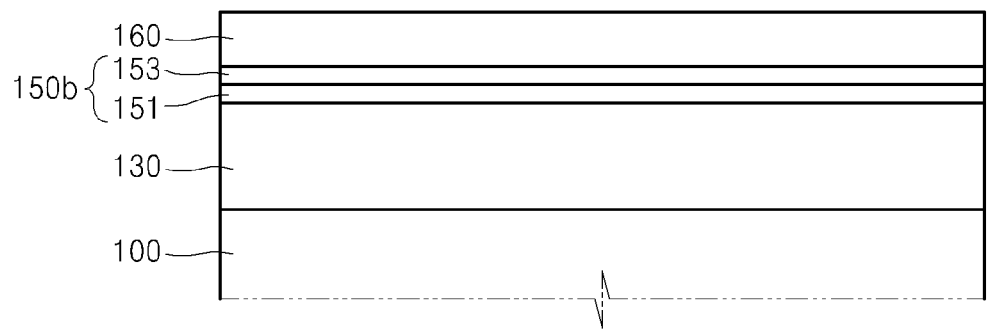

Referring to FIG. 15B, in example embodiments, the ARL 150b formed on the wide bandgap material layer 130 may be a double layer including a first ARL 151 and a second ARL 153. For example, the wide bandgap material layer 130 may be formed of $p^+$-type SiC, and the ARL 150b may include the first ARL 151 serving as a buffer layer and the second ARL 153 formed of hafnium oxide ($HfO_2$) or include the first ARL 151 formed of $SiO_2$ and the second ARL layer 153 formed of silicon oxynitride (SiON).

Here, the buffer layer may be a defect free layer capable of alleviating defects caused by lattice mismatch between the wide bandgap material layer 130 formed of $p^+$-SiC and the second ARL 153 formed of $HfO_2$.

Figure 15C:
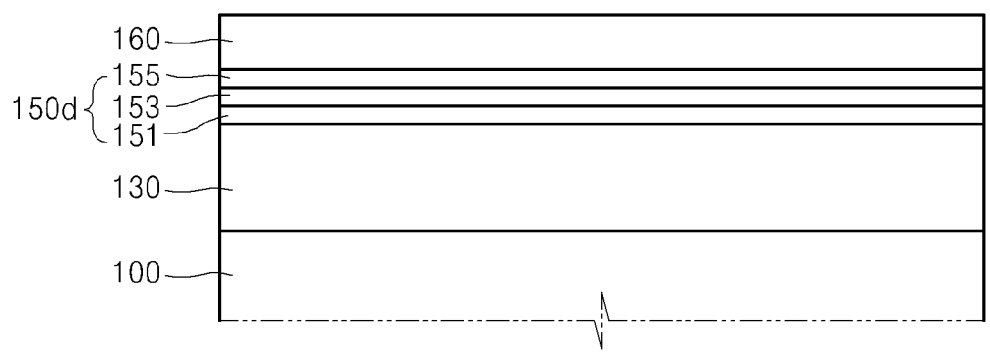

Referring to FIG. 15C, in example embodiments, the ARL 150c formed on the wide bandgap material layer 130 may be a triple layer including a first ARL 151, a second ARL 153, and a third ARL 155. For instance, the wide bandgap material layer 130 may be formed of $p^+$-SiC, and the ARL 150c may include the first ARL 151 serving as a buffer layer, the second ARL 153 formed of $SiN_x$, and the third ARL 155 formed of titanium oxide ($TiO_2$). Also, the ARL 150c may include the first ARL 151 serving as a buffer layer, the second ARL 153 formed of $HfO_2$, and the third ARL 155 formed of $TiO_2$ or include the first ARL 151 serving as a buffer layer, the second ARL 153 formed of an SPA oxide, which refers to an oxide formed using a slot plasma antenna (SPA) process, and the third ARL 155 formed of $SiN_x$. Furthermore, the ARL 150c may include the first ARL 151 serving as a buffer layer, the second ARL 153 formed of hafnium silicon oxide (HfSiO or $HfSiO_x$), and the third ARL 155 formed of $TiO_2$.

Figure 15D:
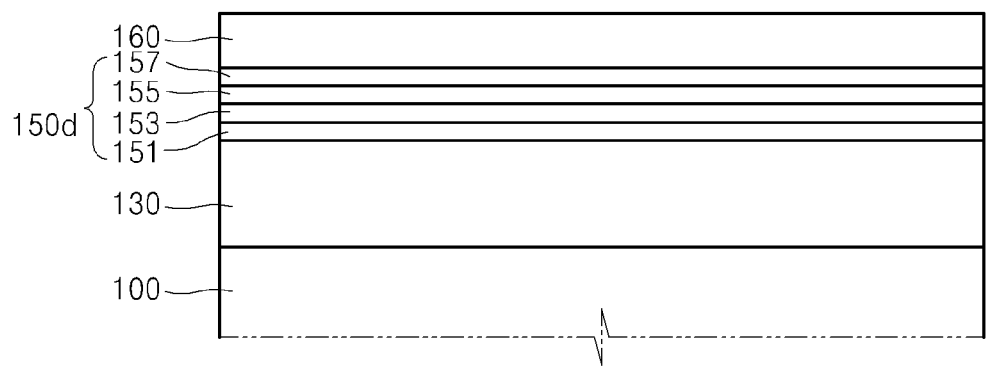

Referring to FIG. 15D, in example embodiments, the ARL 150d formed on the wide bandgap material layer 130 may be a quadruple layer including a first ARL 151, a second ARL 153, a third ARL 155, and a fourth ARL 157. For example, the wide bandgap material layer 130 may be formed of $p^{30}$-SiC, and the ARL 150d may include the first ARL 151 serving as a buffer layer, the second ARL 153 formed of an SPA oxide, the third ARL 155 formed of $HfO_2$, and the fourth ARL 157 formed of $TiO_2$. Also, the ARL 150d may include the first ARL 151 serving as a buffer layer, the second ARL 153 formed of an SPA oxide, the third ARL 155 formed of $SiN_x$, and the fourth ARL 157 formed of $TiO_2$ or include the first ARL 151 serving as a buffer layer, the second ARL 153 formed of an SPA oxide, the third ARL 155 formed of $HfSiO_x$, and the fourth ARL 157 formed of $TiO_2$.

Figure 16:
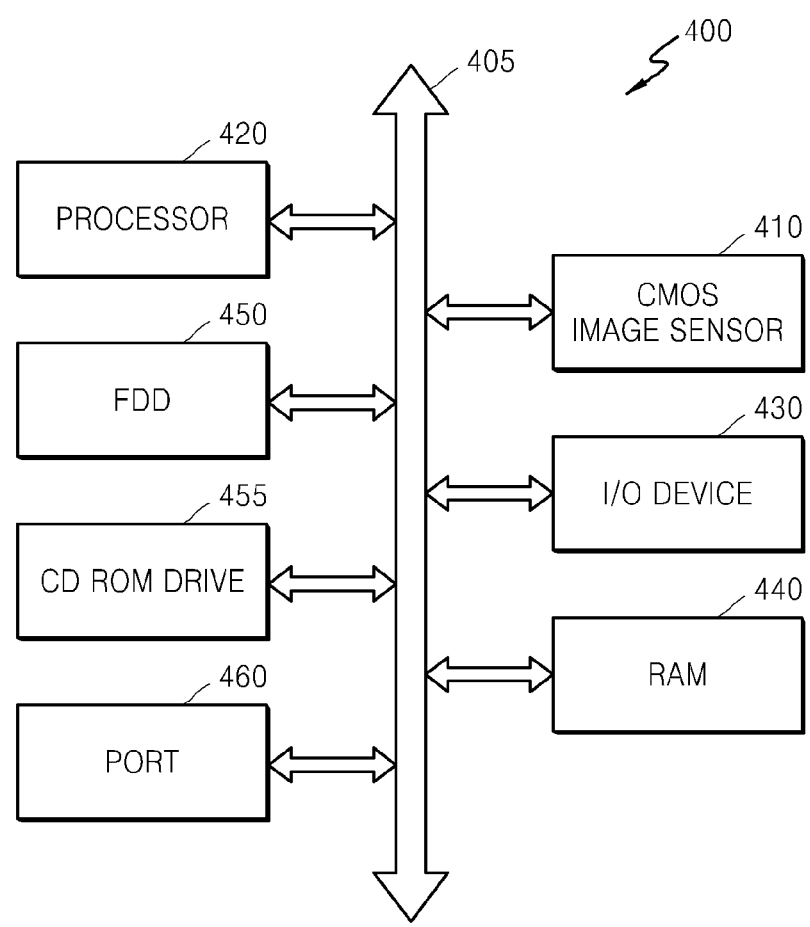
FIG. 16 is a block diagram of an imaging system including the BSI CMOS image sensor of FIG. 4, according to example embodiments of the inventive concepts.

FIG. 16 is a block diagram of an imaging system 400 including the BSI CMOS image sensor of FIG. 4, according to example embodiments of the inventive concepts.

Referring to FIG. 16, the imaging system 400 according to example embodiments may be a system configured to process an output image of a BSI CMOS image sensor 410. The imaging system 400 may be any kind of electrical/electronic system including a CMOS image sensor, such as a computer system, a camera system, a scanner, or an image stabilization system.

The processor-based imaging system 400, such as a computer system, may include a processor 420, such as a microprocessor or a central processing unit (CPU), which may communicate signals or data with an input/output (I/O) device 430 through a bus 405. A floppy disk drive (FDD) 450, a compact-disc read-only-memory (CD ROM) drive 455, a port 460, and a random access memory (RAM) 440 may be connected to the processor 420 through the bus 405 and receive and transmit data from and to the processor 420, thereby enabling reproduction of the output image of the BSI CMOS image sensor 410.

The port 460 may be a port capable of coupling a video card, a sound card, a memory card, and a user serial bus (USB) device or communicating data with another system. The BSI CMOS image sensor 410 may be integrated with a processor, such as a CPU, a digital signal processor (DSP), or a microprocessor and also integrated with a memory. The BSI CMOS image sensor 410 may be integrated as a different chip from a processor as needed.

The imaging system 400 may be a system block diagram, such as a camera phone or a digital camera, among recently developed digital apparatuses.

The imaging system 400 of example embodiments may be a system including the BSI CMOS image sensor 410 in which a wide bandgap material layer may be formed on the pixel array region to reduce sensitivity to blue light and reduce crosstalk.

Figure 17:
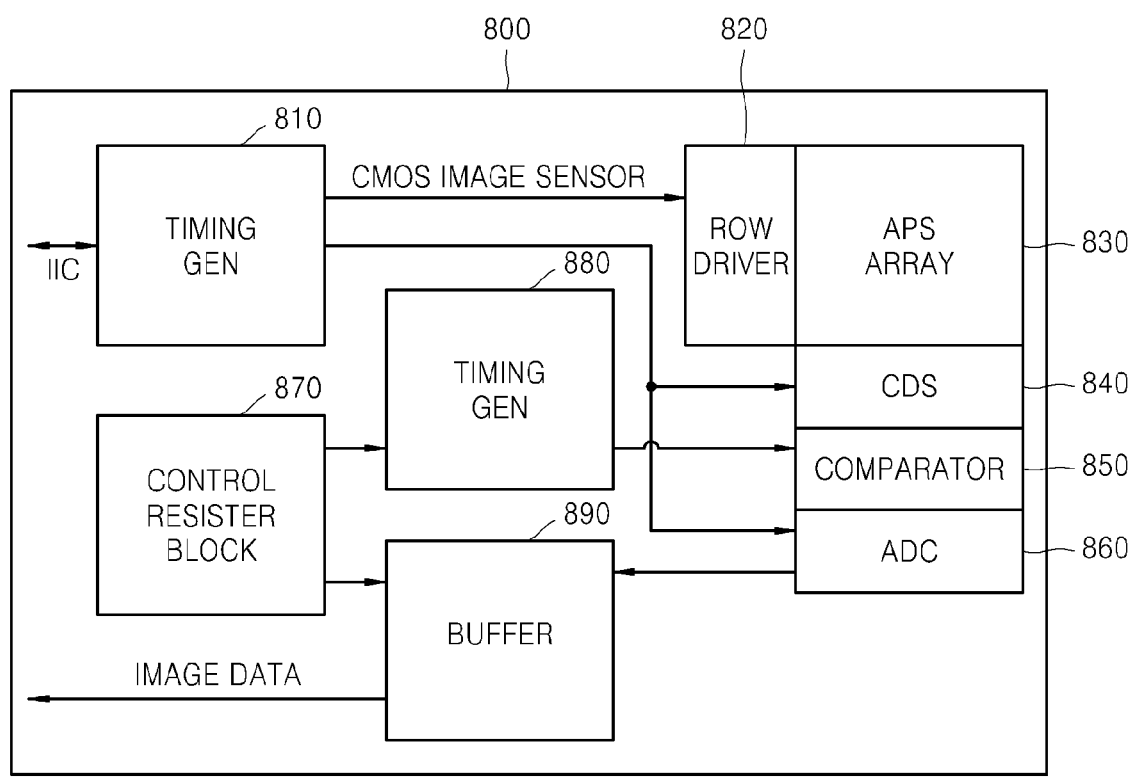
FIG. 17 is a block diagram of a BSI CMOS image sensor including a discrete chip according to example embodiments of the inventive concepts.

FIG. 17 is a block diagram of a BSI CMOS image sensor 800 including a discrete chip, according to example embodiments of the inventive concepts.

Referring to FIG. 17, the BSI CMOS image sensor 800 may include a timing generator 810, an APS array 830, a correlated double sampling (CDS) unit 840, a comparator 850, an analog-to-digital converter (ADC) 860, a buffer 890, and a control resistor block 870.

Light data on a subject captured by an optical lens of the APS array 830 may be converted into electrons, the electrons may be converted into a voltage and amplified, and the CDS unit 840 may remove noise from the amplified voltage so that only required signals can be selected. The comparator 850 may compare the selected signals each other and confirm whether the selected signals are the same. The ADC 860 may convert an analog signal corresponding to data of the corresponded signal into a digital image data signal and transmit the digital image data signal to the buffer 890. The buffer 890 may transmit the digital image data signal to a DSP and a microprocessor to reproduce an image of the subject.

The BSI CMOS image sensor 800 of example embodiments may be a BSI CMOS image sensor in which a wide bandgap material layer is formed on the pixel array region to improve sensitivity to blue light and reduce crosstalk.

Figure 18:
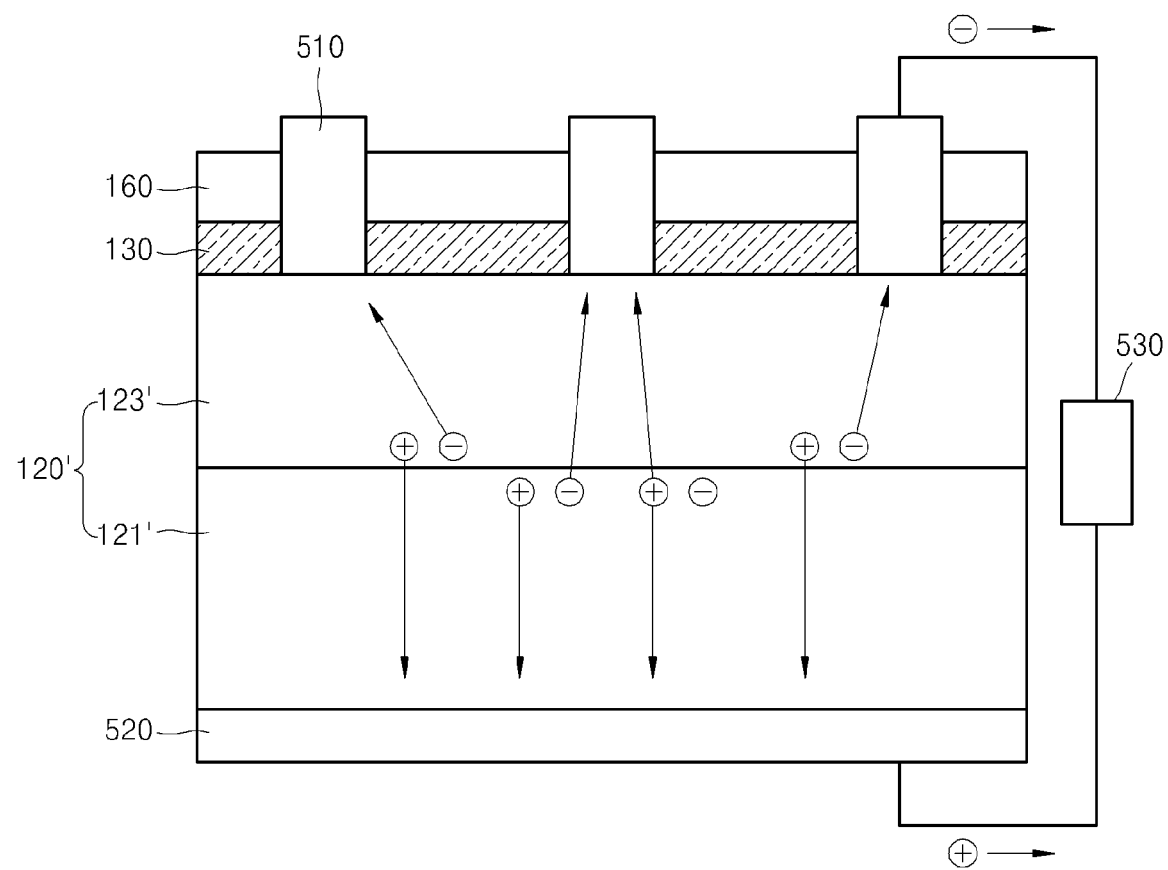
FIG. 18 is a cross-sectional view of a solar cell including the photodiode device of FIG. 1C, according to example embodiments of the inventive concepts.

FIG. 18 is a cross-sectional view of a solar cell including the photodiode device of FIG. 1C, according to example embodiments of the inventive concepts.

Referring to FIG. 18, the solar cell according to example embodiments may include a photodiode 120, a wide bandgap material layer 130, an ARL 160, an upper electrode 510, and a lower electrode 520.

The photodiode 120 may be the photodiode described with reference to FIG. 1C, namely, a PN junction diode. Thus, the photodiode 120 may include a p-type lower semiconductor layer 121 and an n-type upper semiconductor layer 123. Also, a depletion layer (not shown) may be formed at a junction between the p-type semiconductor layer 121 and the n-type semiconductor layer 123.

As shown in FIG. 18, electron-hole pairs may be generated in the junction (i.e., depletion layer) between the p-type semiconductor layer 121 and the n-type semiconductor layer 123, electrons of the generated electron-hole pairs may move to the upper electrode 510, and holes of the electron-hole pairs may move to the lower electrode 520. The moved electros and holes may move to a load 530 connected to the upper and lower electrodes 510 and 520 and accumulate as electric energy, generate heat or light, or perform dynamic operations. The flow of electrons and holes may be interpreted as a kind of current. Thus, it can be seen that the solar cell of example embodiments may serve as an energy source configured to supply current.

The photodiode 120 may be formed of crystalline silicon or amorphous silicon. Crystalline silicon may be greatly divided into single crystalline silicon and polycrystalline silicon. Basically, the crystalline silicon may be used as a pn-homojunction for a solar cell.

Furthermore, the photodiode 120 is not limited to silicon and may be formed of $CuInSe_2$. The photodiode 120 formed of polycrystalline $CuInSe_2$ may include a basic pn-heterojunction structure, have a bandgap of about 1 eV, and typically generate an open-circuit voltage Voc of about 0.5 or lower. In addition, the photodiode 120 may be formed of one of various semiconductor materials, such as GaAs or CdTe.

As mentioned above in the above description of the BSI CMOS image sensor, the wide bandgap material layer 130 may improve the receptivity of blue light to enhance the photoelectric conversion efficiency of a photodiode.

As mentioned above in the above description of the BSI CMOS image sensor, the ARL 160 may function to prevent and/or reduce the reflection of incident light and increase the intensity of light incident to the photodiode. Various ARLs illustrated in FIGS. 15A through 15D may be applied to the solar cell according to example embodiments.

The upper and lower electrodes 510 and 520 may be formed of conductive materials. In particular, the upper electrode 510 may be a transparent electrode, such as an ITO electrode but example embodiments are not limited thereto, to reduce the loss of incident light.

The solar cell of example embodiments may include the wide bandgap material layer 130 formed on the photodiode 120 and increase the transmittance of blue light, thereby improving the photoelectric conversion efficiency of the photodiode to enhance electricity generation capability.

Figure 19A:
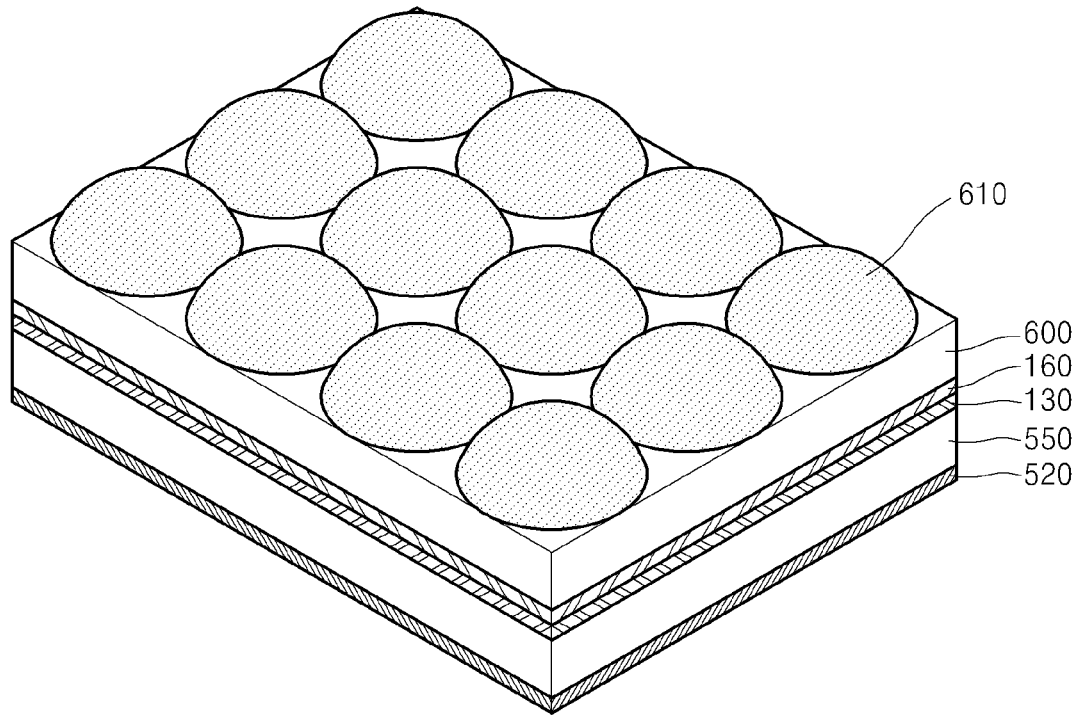
FIGS. 19A through 19C are a perspective, plan, and cross-sectional views of a solar cell device including a plurality of solar cells of FIG. 18.
Figure 19B:
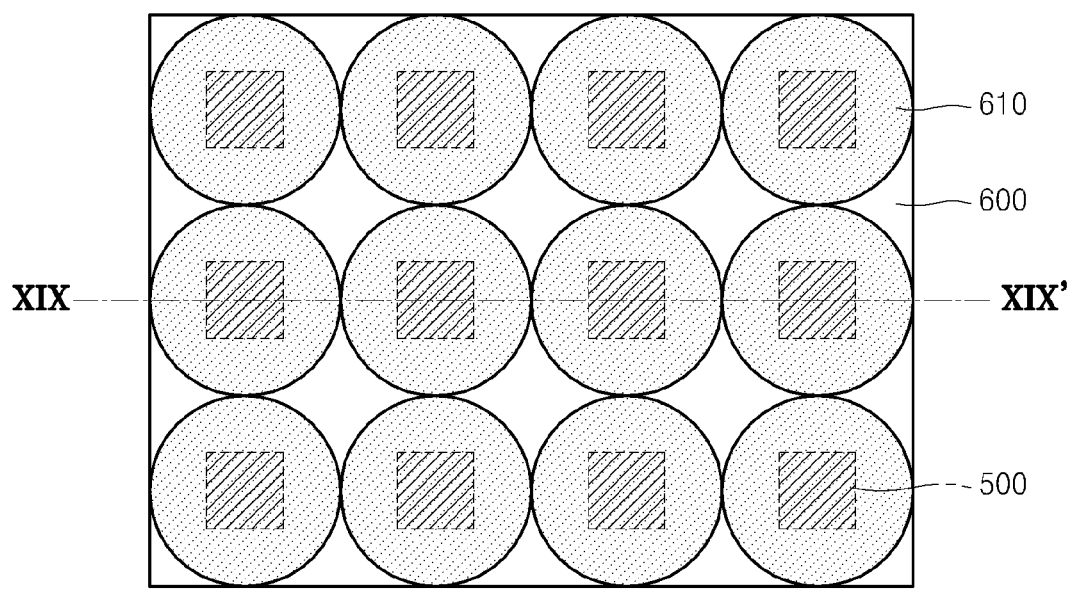
Figure 19C:
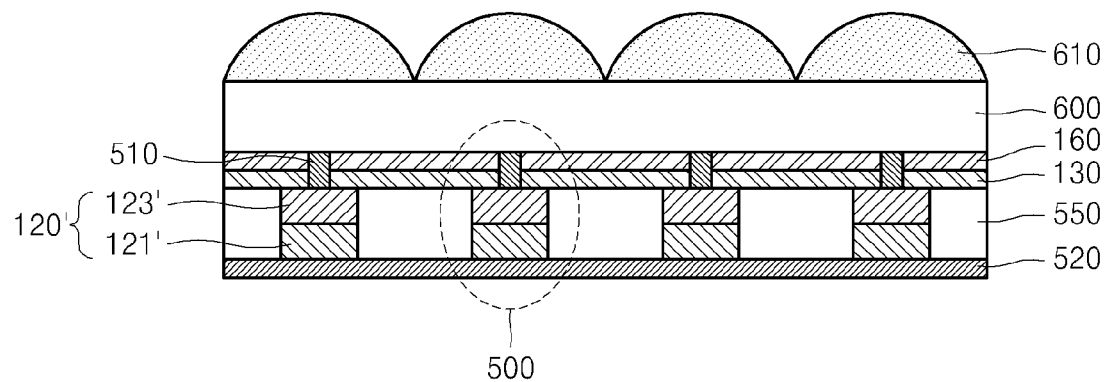

FIGS. 19A through 19C are a perspective, plan, and cross-sectional views of a solar cell device including a plurality of solar cells 500 of FIG. 18. Particular, FIG. 19C is a cross-sectional view taken along a line XIX-XIX' of FIG. 19B.

Referring to FIGS. 19A through 19C, the solar cell device according to example embodiments may include a plate 600 on which microlenses 610 are arranged and the solar cells 500.

As described above with reference to FIG. 18, the solar cells 500 may include a photodiode 120, a wide bandgap material layer 130, an ARL 160, an insulating layer 550, an upper electrode 510, and a lower electrode 520. In the solar cell device according to example embodiments, the solar cells 500 may be arranged in the same polar direction and electrically connected to one another in series or parallel using a connection relationship between the upper and lower electrodes 510 and 520.

For example, when the upper electrode 510 is connected in common to n-type semiconductor layers 123 of photodiodes of the respective solar cells 500 and the lower electrode 520 is connected in common to p-type semiconductor layers 121 of photodiodes of the respective solar cells 500, the solar cells 500 may be connected to one another in parallel. In another case, upper and lower electrodes may be respectively formed on top and bottom surfaces of a photodiode of each of the solar cells 500 and sequentially connected by through vias so that the solar cells 500 can be connected to one another in series.

The plate 600 may be formed of one of various kinds of materials having light transmittance, for example, glass or a polymer compound. The plate 600 may be omitted. Thus, only the microlenses 610 may be formed on the solar cells 500.

The microlenses 610 may be convex lenses formed of a light transmitting material, such as glass or a polymer compound. Although example embodiments illustrate that the plurality of microlenses 610 are convex lenses with the same size, the microlenses 610 may have different shapes and no size limitation as long as the convex lenses have similar focal lengths.

The microlenses 610 may collect light and induce the light to the photodiode 120 of each of the solar cells 500, thereby improving light reception efficiency.

Since the functions of the wide bandgap material layer 130 and the ARL 160 are the same as described with reference to FIG. 18, a description thereof will be omitted.

The upper electrode 510 may be formed of one of various conductive metals or a conductive organic compound, such as a conductive polymer. The upper electrode 510 may have light transmittance as needed. In this case, the upper electrode 510 having light transmittance may be an electrode formed of, for example, indium tin oxide (ITO), Zinc Oxide, Indium Oxide, Indium Zinc Oxide (IZO), or a conductive polymer bonded with carbon nanotubes, but example embodiments are not limited thereto.

The insulating layer 550 may be one of various kinds of electrical insulating material layers, such as a nitride layer, an oxide layer, or an organic compound layer. The insulating layer 550 may electrically isolate the first and second electrodes 510 and 520 from each other and electrically isolate the respective photodiodes 120 from one another. Also, the insulating layer 550 may function to ensure a space where each photodiode 120 of each of the solar cells 500 will be disposed.

The solar cells 500 may be classified into organic or inorganic solar cells. The organic solar cells may include light-absorbing-dyes solar cells, organic nanocrystalline solar cells, organic solar cells, or polymer solar cells. The inorganic solar cells may include inorganic single-crystalline solar cells, inorganic polycrystalline solar cells, inorganic amorphous solar cells, or inorganic nano-crystalline solar cells.

The organic solar cells may include light-absorbing-dyes solar cells, organic nanocrystalline solar cells, organic solar cells, or polymer solar cells. The inorganic solar cells may include inorganic single-crystalline solar cells, inorganic polycrystalline solar cells, inorganic amorphous solar cells, or inorganic nano-crystalline solar cells. More specifically, the solar cells 500 may include single-crystalline silicon solar cells, polycrystalline silicon solar cells, amorphous silicon solar cells, cadmium telluride (CdTe) solar cells, copper indium selenide ($CuInSe_2$) solar cells, gallium arsenide (GaAs) solar cells, germanium (Ge) solar cells, or gallium indium phosphide (GaInP2) solar cells.

The solar cells 500 may be classified into organic or inorganic solar cells. The organic solar cells may include light-absorbing-dyes solar cells, organic nanocrystalline solar cells, organic solar cells, or polymer solar cells. The inorganic solar cells may include inorganic single-crystalline solar cells, inorganic polycrystalline solar cells, inorganic amorphous solar cells, or inorganic nano-crystalline solar cells.

Although inorganic single-crystalline solar cells may have efficiencies of about 25% or lower, the inorganic single-crystalline solar cells may have a size limitation due to their crystalline type and be high-priced. However, the solar cell device according to example embodiments may collect solar light using a plurality of convex lenses and improve light reception efficiency of blue light using a wide bandgap material layer. Accordingly, the number of required solar cells using inorganic single-crystalline materials may be reduced and/or minimized, thereby embodying a large-area, high-efficient, and economical solar cell device.

Although example embodiments illustrates the solar cells 500 with PN junctions, solar cells having different shapes may be applied to example embodiments.

The lower electrode 520 may be formed of one of various conductive metals or a conductive organic compound, such as a conductive polymer. The lower electrode 520 may have light transmittance. The lower electrode 520 having light transmittance may be formed of ITO, Zinc Oxide, Indium Oxide, Indium Zinc Oxide (IZO), and the like, and/or a conductive polymer bonded with carbon nanotubes. The lower electrode 520 may be used to electrically connect the solar cells 500, along with the upper electrode 510.

A photodiode device according to the inventive concepts can adopt a wide bandgap material layer formed on a front surface of a semiconductor substrate, thereby improving the efficiency of conversion of blue light into electricity.

In addition, a BSI CMOS image sensor according to the inventive concepts may solve the absorption of light, sensitivity loss, and crosstalk caused by great refraction of light, based on a BSI structure. Also, the wide bandgap material layer may improve the sensitivity of the BSI CMOS image sensor to blue light and further reduce crosstalk.

Furthermore, since a solar cell according to the inventive concepts includes a wide bandgap material layer formed on a photodiode, the transmittance of blue light may be increased to improve the photoelectric conversion efficiency of the photodiode, thereby increasing electricity generation capability.

While some example embodiments of the inventive concepts has been particularly shown and described, it will be understood that various changes in form and details may be made therein without departing from the spirit and scope of the following claims.

What is claimed is:

1. A back-side-illumination (BSI) complementary-metal-oxide-semiconductor (CMOS) image sensor comprising:
   a photodiode device including,
      substrate;
      at least one photodiode in the substrate; and
      a wide bandgap material layer on a first surface of the substrate;
   a metal interconnection layer disposed on a second surface of the semiconductor substrate;
   an anti-reflective layer (ARL) on the wide bandgap material layer;
   a color filter on the ARL; and
   a microlens on the color filter;
   wherein the ARL includes one of
   a first structure including a silicon nitride ($SiN_x$) layer,
   a second structure including a buffer layer and a hafnium oxide ($HfO_2$) layer,
   a third structure including a silicon oxide ($SiO_2$) layer and a silicon oxynitride (SiON) layer,
   a fourth structure including a buffer layer, a $SiN_x$ layer, and a titanium oxide ($TiO_2$) layer,
   a fifth structure including a buffer layer, a $HfO_2$ layer, and a $TiO_2$ layer,
   a sixth structure including a buffer layer, a slot plasma antenna (SPA) oxide layer, a $HfO_2$ layer, and a $TiO_2$ layer,
   a seventh structure including a buffer layer, an SPA oxide layer, a $SiN_x$ layer, and a $TiO_2$ layer,
   an eighth structure including a buffer layer, an SPA oxide layer, and a $SiN_x$ layer,
   a ninth structure including a buffer layer, an SPA oxide layer, a hafnium silicon oxide ($HfSiO_x$) layer, and a $TiO_2$ layer, and
   a tenth structure including a buffer layer, a $HfSiO_x$ layer, and a $TiO_2$ layer.

2. The sensor of claim 1, wherein
   the wide bandgap material layer includes a material having a low absorption coefficient with respect to blue light.

3. The sensor of claim 1, wherein
   the wide bandgap material layer includes one of $p^+$-SiC, $p^+$-SiN, and $p^+$-SiCN.

4. The sensor of claim 1, further comprising:
a $p^+$-silicon layer between the wide bandgap material layer and the substrate; and
the substrate includes a $p^-$-type silicon substrate.
5. The sensor of claim 1, wherein
the substrate includes a pixel array region and a peripheral circuit region, and
the wide bandgap material layer is on the entire pixel array region.
6. The sensor of claim 1, wherein
the substrate is includes a pixel array region and a peripheral circuit region, and
the wide bandgap material layer is formed only on a portion of the pixel array region corresponding to a blue pixel.
7. The sensor of claim 1, wherein
the wide bandgap material layer includes a $p^+$-SiC layer obtained by implanting carbon (C) ions into a $p^+$-silicon layer.
8. The sensor of claim 7, wherein
the substrate is a $p^-$-type silicon substrate,
the $p^+$-silicon layer is on the substrate, and
the wide bandgap material layer is formed by implanting C ions into one of the entire region of the $p^+$-silicon layer and a partial upper region of the $p^+$-silicon layer.
9. The sensor of claim 7, wherein
the wide bandgap material layer is a laser annealed layer.
10. The sensor of claim 1, further comprising:
a passivation layer on the ARL.

* * * * *